United States Patent
Moriwaki

(10) Patent No.: US 9,461,033 B2
(45) Date of Patent: Oct. 4, 2016

(54) ELECTRO-OPTICAL DEVICE, ELECTRONIC APPARATUS AND SEMICONDUCTOR DEVICE

(71) Applicant: SEIKO EPSON CORPORATION, Tokyo (JP)

(72) Inventor: Minoru Moriwaki, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/672,584

(22) Filed: Mar. 30, 2015

(65) Prior Publication Data

US 2015/0279835 A1 Oct. 1, 2015

(30) Foreign Application Priority Data

Apr. 1, 2014 (JP) ................................. 2014-075166

(51) Int. Cl.
*H01L 27/02* (2006.01)
*H01L 27/12* (2006.01)
*G02F 1/1362* (2006.01)

(52) U.S. Cl.
CPC ..... *H01L 27/0266* (2013.01); *G02F 1/136204* (2013.01); *H01L 27/0255* (2013.01); *H01L 27/0296* (2013.01); *H01L 27/1214* (2013.01); *H01L 27/1251* (2013.01)

(58) Field of Classification Search
CPC .................................................. H01L 27/0266
See application file for complete search history.

(56) References Cited

U.S. PATENT DOCUMENTS

| | | | | |
|---|---|---|---|---|
| 6,590,229 | B1* | 7/2003 | Yamazaki | G02F 1/136213 257/71 |
| 7,645,646 | B2* | 1/2010 | Young | H01L 27/1214 257/E21.361 |
| 7,786,958 | B1* | 8/2010 | Koyama | G09G 3/3233 345/76 |
| 2010/0065851 | A1* | 3/2010 | Makita | H01L 27/12 257/72 |
| 2012/0146028 | A1* | 6/2012 | Oda | H01L 27/1214 257/53 |

FOREIGN PATENT DOCUMENTS

| | | |
|---|---|---|
| JP | 2004-303774 A | 10/2004 |
| JP | 2011-222971 A | 11/2011 |

* cited by examiner

*Primary Examiner* — Eugene Lee
(74) *Attorney, Agent, or Firm* — Maschoff Brennan

(57) ABSTRACT

In an element substrate of an electro-optical device, MOS transistors (electrostatic protection element) are provided on an opposite side to a light transmitting substrate with respect to the insulating film, and heat dissipation layers that overlap drain regions of the MOS transistor in a plan view are provided between the light transmitting substrate and the insulating film. In addition, the heat dissipation layers are connected to the drain regions through contact holes which are formed in the insulating film.

5 Claims, 11 Drawing Sheets

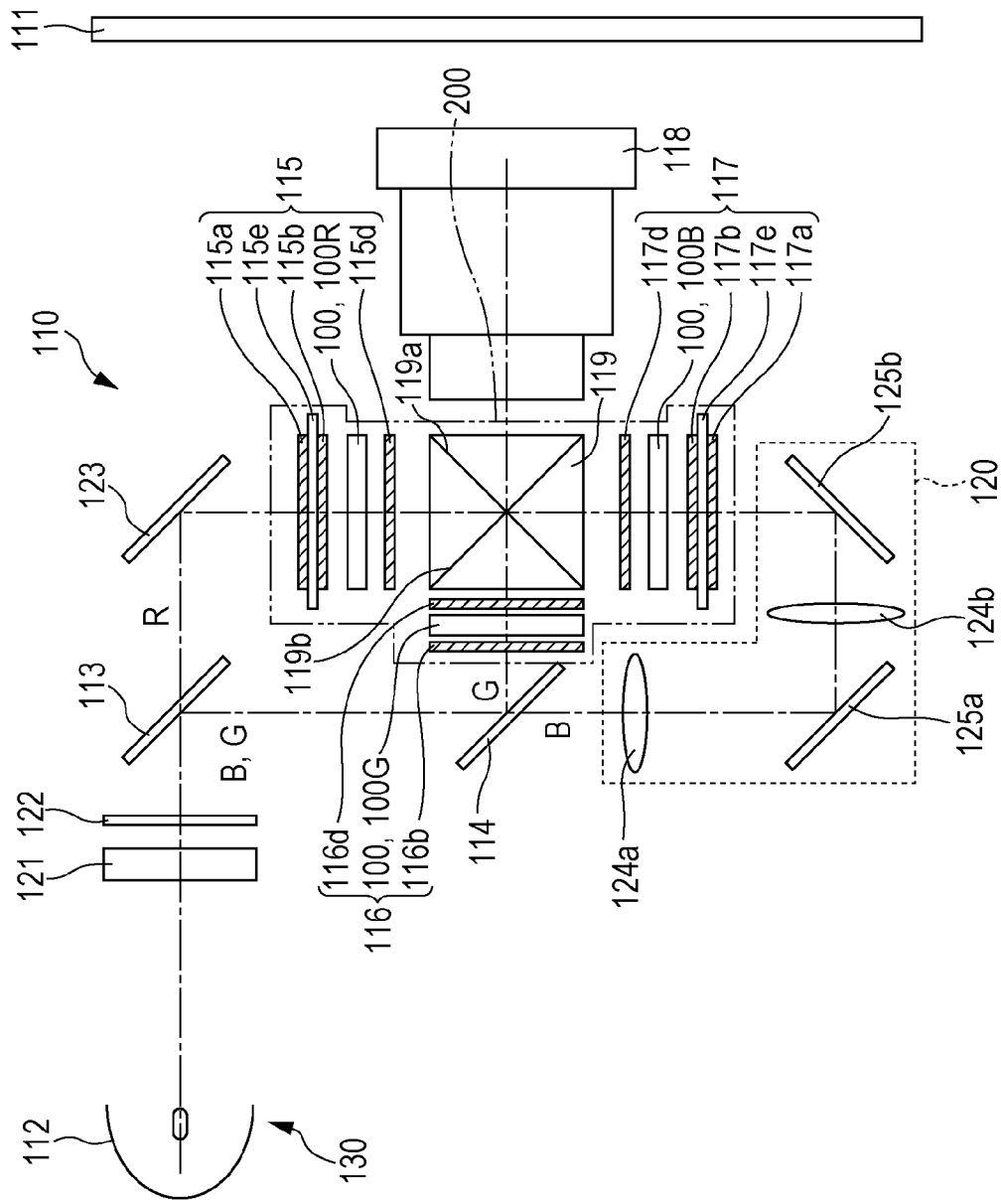

ELECTRO-OPTICAL DEVICE, ELECTRONIC APPARATUS AND SEMICONDUCTOR DEVICE

BACKGROUND

1. Technical Field

The present invention relates to an electro-optical device in which an electrostatic protection element is formed in a substrate, an electronic apparatus including the electro-optical device, and a semiconductor device in which an electrostatic protection element is formed in a substrate.

2. Related Art

In an element substrate or a semiconductor device which is used for an electro-optical device such as a liquid crystal device, an electrostatic protection element which is configured by a diode-connected MOS type transistor is provided between a signal line and a constant potential line (refer to JP-A-2004-303774 and JP-A-2011-222971). If a large current flows through a drain region of the MOS type transistor when the electrostatic protection element discharges static electricity, there is a possibility that the electrostatic protection element may be damaged by the heat generated at the time. Thus, JP-A-2004-303774 proposes that a contact with a drain side is appropriately provided and a distance from a gate terminal is lengthened. In addition, JP-A-2011-222971 proposes that a trench is provided in the drain region, and a distance from the gate terminal is substantially lengthened.

However, in a case in which an insulating film such as a silicon oxide is provided in a portion of a substrate and an electrostatic protection element is provided on the insulating film, a heat dissipation property from the electrostatic protection element to the periphery is decreased, and thus there is a problem that damage caused by heat generation in the drain region cannot be prevented by configurations described in JP-A-2004-303774 and JP-A-2011-222971.

SUMMARY

An advantage of some aspects of the invention is that an electro-optical device in which damage caused by heat generation of an electrostatic protection element can be suppressed by increasing a heat dissipation property from the electrostatic protection element formed on an insulating film, an electronic apparatus including the electro-optical device, and a semiconductor device in which an electrostatic protection element is formed in a substrate, are provided.

According to a first aspect of the invention, an electro-optical device includes: an insulating film that is provided above one surface side of a substrate; a pixel switching element that is provided above the insulating film; a pixel electrode that is electrically connected to the pixel switching element; a signal line that is provided above one surface side of the substrate; a potential line that is provided on one surface side of the substrate; an electrostatic protection element that is configured as a diode with a MOS transistor structure which is provided above the insulating film, the electrostatic protection element is electrically connected to the signal line and the potential line in a state of being reversely biased; and a heat dissipation layer that overlaps a drain region of the MOS transistor, the drain region is electrically connected to the potential line in a plan view, the heat dissipation layer is connected to the drain region through a contact hole which is formed in the insulating film.

"MOS transistor" of the invention means a structure, a gate electrode is not limited to a metal, and may be a conductive polysilicon. In addition, a gate insulating film is not limited to an oxide film, and may be a nitride film or the like.

In the invention, an electrostatic protection element configured by an MOS transistor is provided on an opposite side to a substrate with respect to an insulating film, and a heat dissipation layer which overlaps a drain region of the MOS transistor in a plan view is provided between the substrate and the insulating film. In addition, the heat dissipation layer is connected to the drain region through a contact hole formed in the insulating film. For this reason, when the static electricity input to the signal lines is released through the electrostatic protection element, even if a large current flows through the drain region of the MOS transistor and thereby heat is generated, it is possible to make the heat escape into the heat dissipation layer through the contact hole. Thus, even though the electrostatic protection element is formed on the insulating film, it is possible to reduce a loss of the electrostatic protection element due to the heat.

In the invention, it is preferable that the heat dissipation layer is configured by a conductive film. According to this configuration, it is also possible to make a current flowing through the drain region escape into the heat dissipation layer. Thus, since heat generation in the drain region can be suppressed, it is possible to reduce a loss of the electrostatic protection element due to the heat.

In the invention, it is preferable that the heat dissipation layer does not overlap a gate electrode of the MOS transistor. According to this configuration, it is possible to prevent the MOS transistor from malfunctioning by a potential change of the heat dissipation layer.

In the invention, it is preferable that the bottom of the contact hole in the heat dissipation layer is configured by a concave portion. According to this configuration, a contact area of the drain region of the MOS transistor and the heat dissipation layer can be widened. Thus, even if heat is generated in the drain region, it is possible to efficiently make the heat escape into the heat dissipation layer through the contact hole.

According to a second aspect of the invention, an electro-optical device includes: an insulating film that is provided above one surface side of a substrate; a pixel switching element that is provided above the insulating film; a pixel electrode that is electrically connected to the pixel switching element; a signal line that is provided above one surface side of the substrate; a potential line that is provided on one surface side of the substrate; an electrostatic protection element that is configured as a diode element which is provided above the insulating film, the electrostatic protection element is electrically connected to the signal line and the potential line; and a heat dissipation layer that overlaps a pn junction area of the diode element in a plan view between the substrate and a portion in which a thickness of the insulating film is equal to or greater than 200 nm and is equal to or less than 1000 nm.

In the invention, the electrostatic protection element configured by the diode element is provided on an opposite side to the substrate with respect to the insulating film, and the heat dissipation layer which overlaps the pn junction area of the diode element in a plan view is provided between the substrate and the insulating film. In addition, the thickness of the insulating film existing between the pn junction area of the diode element and the heat dissipation layer is equal to or greater than 200 nm and is equal to or less than 1000 nm. For this reason, when the static electricity input to the signal lines is released through the electrostatic protection element, even if a large current flows through the pn junction area of the diode element and thereby heat is generated, it is possible to make the heat escape into the heat dissipation layer. Thus, even though the electrostatic protection element is formed on the insulating film, it is possible to reduce a loss of the electrostatic protection element due to the heat.

In the invention, it is preferable that the heat dissipation layer overlaps the entire diode element in a plan view. According to this configuration, it is possible to make the heat of the diode element escape into the heat dissipation layer.

It is effective if the invention is applied to a case in which the substrate is a quartz substrate or a glass substrate. In a case in which the substrate is a quartz substrate or a glass substrate, it is difficult to make the heat escape, compared to a semiconductor substrate, but since the heat of the electrostatic protection element escapes to the heat dissipation layer, it is possible to reduce a loss of the electrostatic protection element due to the generated heat.

In the invention, it is preferable that a light shielding layer that overlaps the pixel switching element in a plan view between the substrate and the insulating film, and the light shielding layer is formed in the same layer as the heat dissipation layer. According to this configuration, it is possible to simultaneously form the light shielding layer and the heat dissipation layer.

In the invention, it is preferable that the signal line is formed by a plurality of lines, the electrostatic protection element is provided with respect to each of the plurality of signal lines, and the heat dissipation layer is continuously formed with respect to the electrostatic protection element corresponding to each of the plurality of signal lines. According to this configuration, since the heat dissipation layer is continuously formed in a wide area, it is easy for the heat of the electrostatic protection element to escape into the heat dissipation layer.

The electro-optical device according to the invention can be used for an electronic apparatus, such as a mobile phone, a mobile computer, and a projection type display device. The projection type display device of the electronic apparatuses includes a light source unit for supplying light to the electro-optical device (liquid crystal device), and a projection optical system that projects the light which is optically modulated by the electro-optical device.

The invention can be applied to a semiconductor device other than the above-described electro-optical device. In this case, according to a third aspect of the invention, a semiconductor device includes: a substrate in which semiconductor elements are provided; an insulating film that is provided above one surface side of the substrate; a signal line that is provided above one surface side of the substrate; a potential line that is provided on one surface side of the substrate; an electrostatic protection element that is configured as a diode with a MOS transistor structure which is provided above the insulating film, the electrostatic protection element is electrically connected to the signal line and the potential line in a state of being reversely biased; and a heat dissipation layer that overlaps a drain region of the MOS transistor, the drain region is electrically connected to the potential line in a plan view, the heat dissipation layer is connected to the drain region through a contact hole which is formed in the insulating film.

In the invention, an electrostatic protection element configured by an MOS transistor is provided on an opposite side to a substrate with respect to an insulating film, and a heat dissipation layer which overlaps a drain region of the MOS transistor in a plan view is provided between the substrate and the insulating film. In addition, the heat dissipation layer is connected to the drain region through a contact hole formed in the insulating film. For this reason, when the static electricity input to the signal lines is released through the electrostatic protection element, even if a large current flows through the drain region of the MOS transistor and thereby heat is generated, it is possible to make the heat escape into the heat dissipation layer through the contact hole. Thus, even though the electrostatic protection element is formed on the insulating film, it is possible to reduce a loss of the electrostatic protection element due to the heat.

In addition, a semiconductor device according to another aspect of the invention includes: a substrate in which semiconductor elements are provided; an insulating film that is provided above one surface side of the substrate; a signal line that is provided above one surface side of the substrate; a potential line that is provided on one surface side of the substrate; an electrostatic protection element that is configured as a diode element which is provided above the insulating film, the electrostatic protection element is electrically connected to the signal line and the potential line; and a heat dissipation layer that overlaps a pn junction area of the diode element in a plan view between the substrate and a portion in which a thickness of the insulating film is equal to or greater than 200 nm and is equal to or less than 1000 nm.

In the semiconductor device according to the invention, the electrostatic protection element configured by the diode element is provided on an opposite side to the substrate with respect to the insulating film, and the heat dissipation layer which overlaps the pn junction area of the diode element in a plan view is provided between the substrate and the insulating film. In addition, the thickness of the insulating film existing between the pn junction area of the diode element and the heat dissipation layer is equal to or greater than 200 nm and is equal to or less than 1000 nm. For this reason, when the static electricity input to the signal lines is released through the electrostatic protection element, even if a large current flows through the pn junction area of the diode element and thereby heat is generated, it is possible to make the heat escape into the heat dissipation layer. Thus, even though the electrostatic protection element is formed on the insulating film, it is possible to reduce a loss of the electrostatic protection element due to the heat.

BRIEF DESCRIPTION OF THE DRAWINGS

The invention will be described with reference to the accompanying drawings, wherein like numbers reference like elements.

FIGS. 9A and 9B are schematic configuration diagrams of a projection type display device (electronic apparatus) to which the invention is applied and an optical unit.

DESCRIPTION OF EXEMPLARY EMBODIMENTS

Hereinafter, as embodiments of the invention, a liquid crystal device which is a representative electro-optical device will be described. In the figures referred to in the following description, in order to set each layer or each member to a size which can be recognized in the figures, a dimension is set differently from each other in each layer or each member. In addition, in the figures referred to in the following description, the number of wires such as scan lines, data lines, and signal lines, or the like is illustrated to be less than actual.

Embodiment 1

Figure 1A:
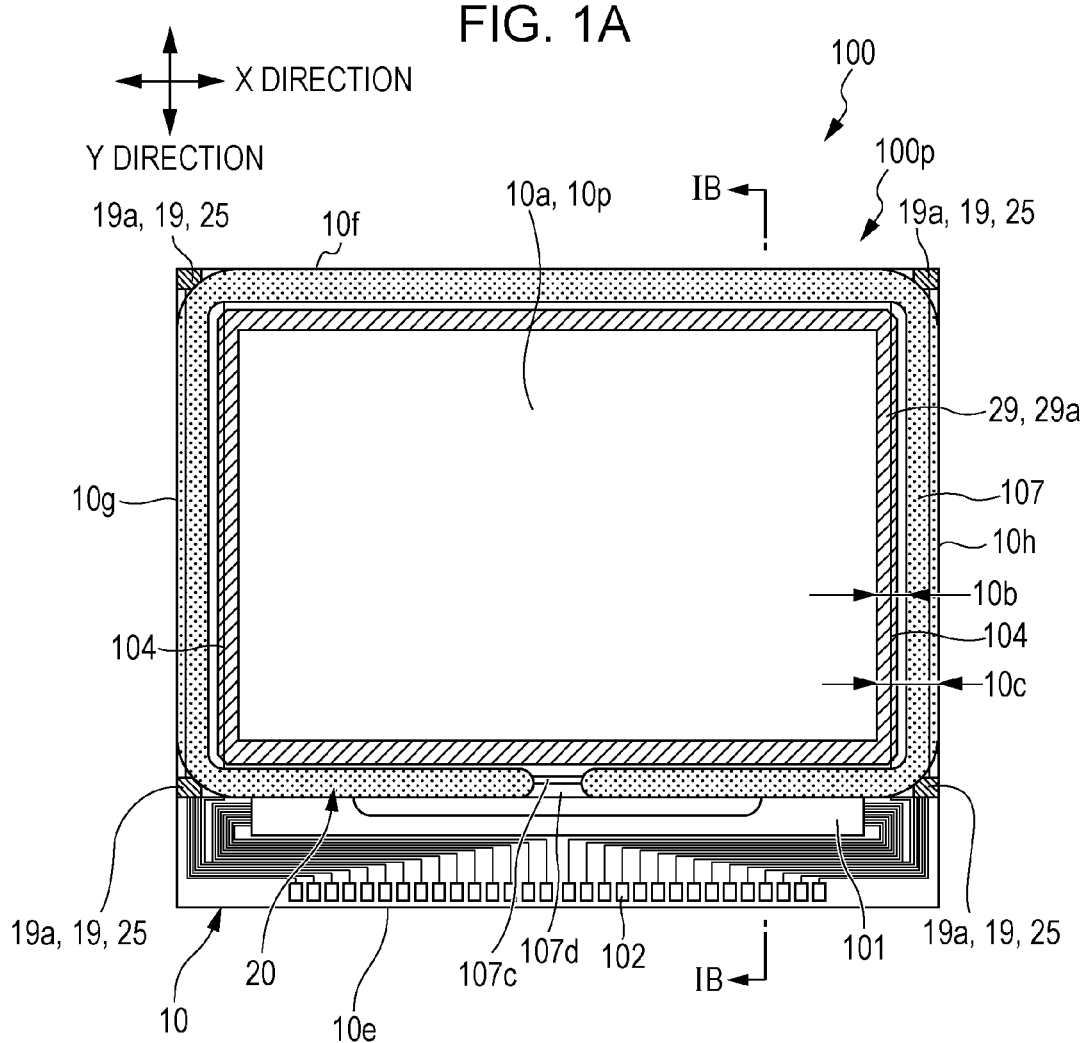
FIGS. 1A and 1B are explanatory views of a liquid crystal panel of an electro-optical device according to Embodiment 1 of the invention.
Figure 1B:
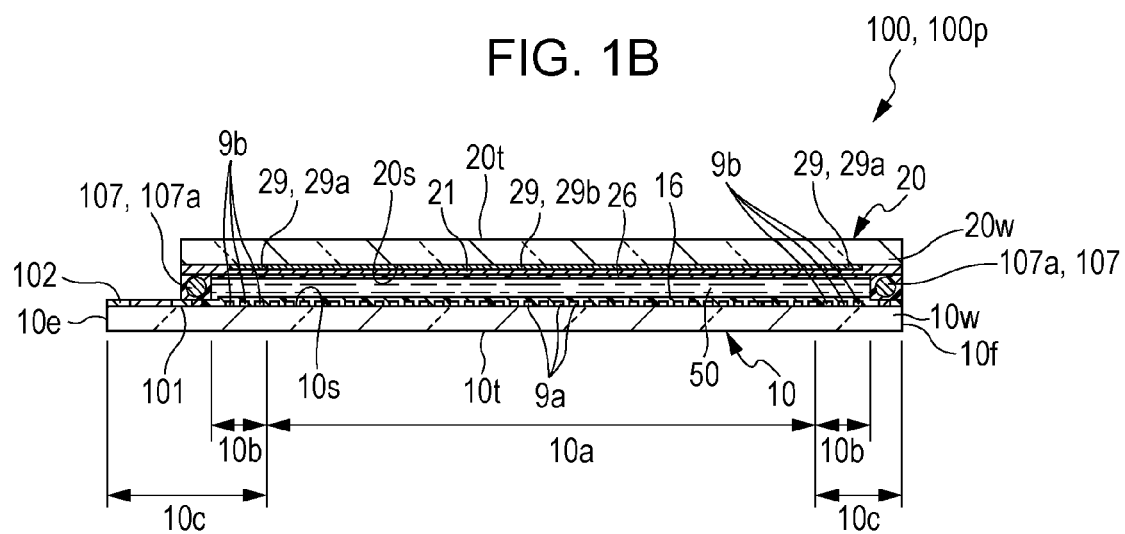

FIGS. 1A and 1B are explanatory views of a liquid crystal panel of an electro-optical device according to Embodiment 1 of the invention. FIG. 1A is a plan view of a liquid crystal panel and each configuration element viewed from a counter substrate side, and FIG. 1B is a IB-IB cross-sectional view.

As illustrated in FIGS. 1A and 1B, the electro-optical device 100 according to the present embodiment is a liquid crystal device, and includes a liquid crystal panel 100p. In the liquid crystal panel 100p, an element substrate 10 and a counter substrate 20 are bonded by a seal material 107 through a gap, and the seal material 107 is provided along an outer edge of the counter substrate 20. The seal material 107 is an adhesive formed of a photocurable resin, a thermosetting resin, or the like, and is mixed with a gap material 107a such as a glass fiber or glass beads, such that a distance between the two substrates are set to a predetermined value. In a liquid crystal panel 100p, an electro-optical layer 50 formed of a liquid crystal layer is provided, between the element substrate 10 and the counter substrate 20, within an area surrounded by the seal material 107. In the present embodiment, in the seal material 107, an interrupted portion is formed as a liquid crystal injection hole 107c, and the liquid crystal injection hole 107c is sealed by a sealing material 107d after a liquid crystal material is injected.

In the liquid crystal panel 100p having such a configuration, the element substrate 10 and the counter substrate 20 are both quadrangular in shape, and the element substrate 10 includes two side surfaces 10e and 10f opposing the Y direction (second direction) and two side surfaces 10g and 10h opposing the X direction (first direction). In approximately the center of the liquid crystal panel 100p, a display region 10a is provided as an area of a quadrangle, and the seal material 107 is also substantially quadrangular corresponding to the shape. An outer side of the display region 10a is formed of an outer peripheral region 10c of a quadrangular frame shape.

In the outer peripheral region 10c in the element substrate 10, a data line drive circuit 101 and a plurality of terminals 102 are formed along a side surface 10e positioned on one side in the Y axis direction in the element substrate 10, and a scan line drive circuit 104 is formed along each of the other side surfaces 10g and 10h adjacent to the side surface 10e. A flexible wiring substrate (not illustrated) is connected to the terminal 102, and various potentials and various signals are input to the element substrate 10 from an external control circuit through the flexible wiring substrate.

Detailed description will be made later with reference to FIG. 3, but in the one surface 10s side opposing the counter substrate 20, among one surface 10s and the other surface 10t of the element substrate 10, pixel electrodes 9a, pixel switching elements 30 which will be described later with reference to FIG. 2 or the like, and the like are arranged in a matrix form in the display region 10a. Thus, the display region 10a is configured as a pixel electrode arrangement region 10p in which the pixel electrodes 9a are arranged in a matrix form. In the element substrate 10 having such a configuration, an orientation film 16 is formed on an upper layer side of the pixel electrode 9a. On the one surface 10s side of the element substrate 10, in the outer peripheral region 10c on the outside of the display region 10a, dummy pixel electrodes 9b which are simultaneously formed with the pixel electrodes 9a are formed in a peripheral region 10b of a quadrangular frame shape interposed between the display region 10a and the seal material 107.

The common electrode 21 is formed on one surface 20s side, which opposes the element substrate 10, among the one surface 20s and the other surface 20t of the counter substrate 20. A common electrode 21 is formed across approximately the entire surface of the counter substrate 20 or across a plurality of pixels 100a configured as a plurality of strip electrodes. In the present embodiment, the common electrode 21 is formed on approximately the entire surface of the counter substrate 20.

In the one surface 20s side of the counter substrate 20, a light shielding layer 29 is formed on a lower layer side of the common electrode 21, and an orientation film 26 is stacked on the surface of the common electrode 21. The light shielding layer 29 is formed as a frame portion 29a extending along an outer peripheral edge of the display region 10a, and the display region 10a is specified by an inner peripheral edge of the light shielding layer 29. In addition, the light shielding layer 29 is formed also as a black matrix portion 29b which overlaps an inter-pixel area interposed between the pixel electrodes 9a adjacent to each other. The frame portion 29a is formed in a position which overlaps the dummy pixel electrode 9b, and the outer peripheral edge of the frame portion 29a is positioned in a place in which a gap is formed between the inner peripheral edge of the seal material 107 and the outer peripheral edge of the frame portion 29a. Thus, the frame portion 29a and the seal material 107 do not overlap each other.

In the liquid crystal panel 100p, on the outside of the seal material 107, the inter-substrate conduction electrodes 25 are formed in four corners on the one surface 20s side of the counter substrate 20, and the inter-substrate conduction electrodes 19 are formed in positions opposing four corners (inter-substrate conduction electrodes 25) of the counter substrate 20, on the one surface 10s side of the element substrate 10. In the present embodiment, the inter-substrate conduction electrode 25 becomes a portion of the common electrode 21. The common potential Vcom is applied to the inter-substrate conduction electrode 19. An inter-substrate conduction material 19a including conductive particles is disposed between the inter-substrate conduction electrode 19 and the inter-substrate conduction electrode 25, and the common electrode 21 of the counter substrate 20 are electrically connected to the element substrate 10 through the inter-substrate conduction electrode 19, the inter-substrate conduction material 19a, and the inter-substrate conduction electrode 25. For this reason, a common potential Vcom is applied to the common electrode 21 from the element substrate 10 side. The seal material 107 is provided along the outer peripheral edge of the counter substrate 20, with approximately the same width dimension, but an area which overlaps the corner portion of the counter substrate 20 is provided so as to avoid the inter-substrate conduction electrodes 19 and 25 and pass through an inner side.

In the present embodiment, the electro-optical device 100 is a transmission type liquid crystal device, and the pixel electrode 9a and the common electrode 21 are formed by a light transmitting conductive film, such as an Indium Tin Oxide (ITO) film or an Indium Zinc Oxide (IZO) film. In the transmission type liquid crystal device (electro-optical device 100), for example, light which is incident from the counter substrate 20 side is modulated while being emitted from the element substrate 10, and displays an image. In addition, in a case in which the electro-optical device 100 is a reflection type liquid crystal device, the common electrode 21 is formed by a light transmitting conductive film such as an ITO film or an IZO film, and the pixel electrode 9a is formed by a reflective conductive film such as an aluminum oxide film. In the reflection type liquid crystal device (electrode-optical device 100), light which is incident from the counter substrate 20 side is modulated while being reflected by and emitted from the element substrate 10 among the element substrate 10 and the counter substrate 20, and displays an image.

The electro-optical device 100 can be used as a camera display device of an electronic apparatus, such as a mobile computer, or a mobile phone, and in this case, a color filter (not illustrated) is formed in the counter substrate 20. In addition, the electro-optical device 100 can be used as an electronic paper. In addition, in the electro-optical device 100, a Polaroid film, a phase difference film, a polarizing plate, and the like are disposed in a predetermined direction with respect to the liquid crystal panel 100p, according to a type of the electro-optical layer 50 to be used, or a normally white mode and a normally black mode. Furthermore, the electrode-optical device 100 can be used as a light valve for RGB for a projection type display device (liquid crystal projector) which will be described later. In this case, light of each color which is decomposed through a dichotic mirror for RGB color decomposition is respectively incident into each of the electro-optical devices 100 for RGB, as projected light, and thus a color filter is not formed in each of the electro-optical device 100 for RGB.

Electrical Configuration of Element Substrate 10

Figure 2A:
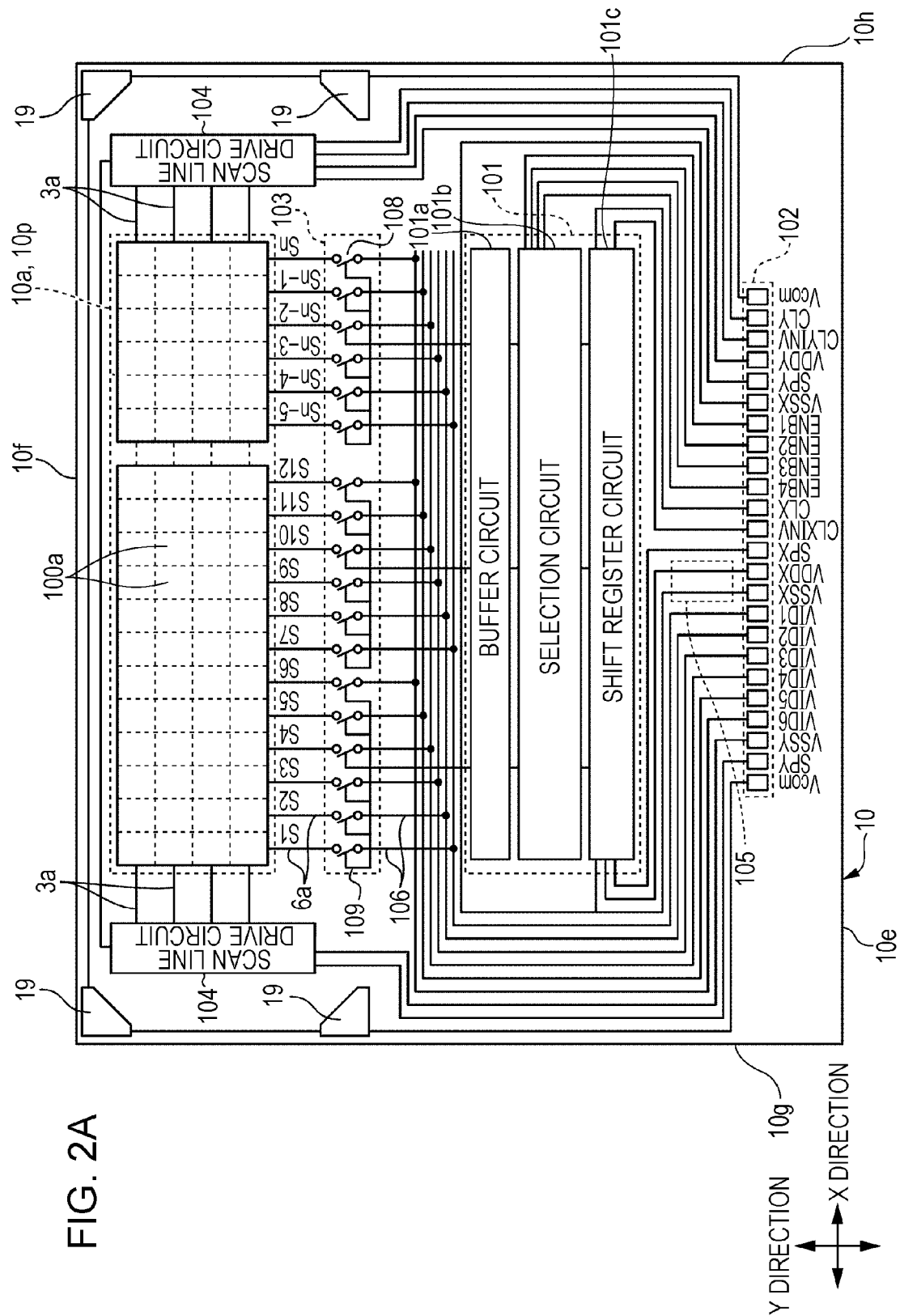
FIGS. 2A and 2B are explanatory diagrams illustrating an electrical configuration of an element substrate of the electro-optical device according to Embodiment 1 of the invention.
Figure 2B:
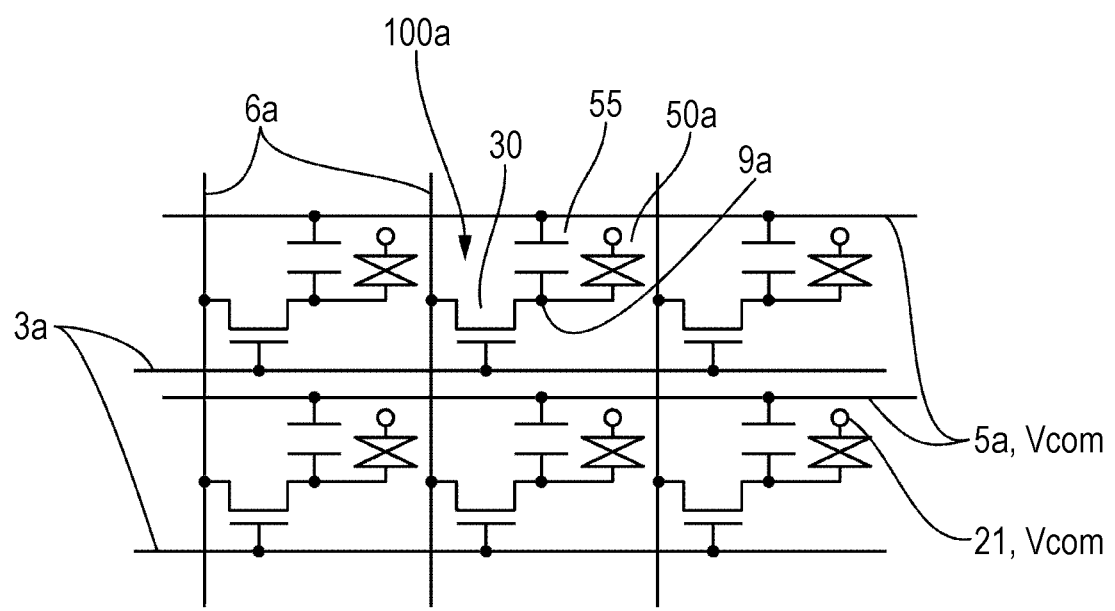

FIGS. 2A and 2B are explanatory diagrams illustrating an electrical configuration of the element substrate 10 of the electro-optical device 100 according to Embodiment 1 of the invention, and FIG. 2A is an explanatory diagram illustrating a circuit or a plan layout of wires of the element substrate 10 and FIG. 2B is an explanatory diagram illustrating an electrical configuration of pixels. In the following description, for names of signals which are input to the element substrate 10 through the terminals 102, and wires for the signals, the same alphabet symbols are given to rear of the signals and wires L. For example, "clock signal line LCLX is given to a wire for a signal corresponding to "clock signal CLX" which is a signal name. In addition, in the following description, for names of the signals which are input to the element substrate 10 through the terminal 102, and terminals for the signals, the same alphabet symbols are respectively given to the rear of the signals and terminals T. For example, "terminal TCLK" is given to the terminal 102 corresponding to "clock signal CLX" which is a signal name.

As illustrated in FIGS. 2A and 2B, in the electro-optical device 100, the pixel electrode arrangement region 10p in which a plurality of pixels 100a is arranged in a matrix form is provided in the center of the element substrate 10, and an area surrounded by an inner edge of the frame portion 29a illustrated in FIG. 1B is the display region 10a, in the pixel electrode arrangement region 10p. In the element substrate 10, a plurality of scan lines 3a extending in the X direction and a plurality of data lines 6a extending in the Y direction are formed inside the pixel electrode arrangement region 10p, and the pixels 100a are configured in positions corresponding to the intersections. In each of a plurality of pixels 100a, the pixel switching element 30 configured by a TFT or the like, and the pixel electrode 9a are formed. The data line 6a is electrically connected to a source of the pixel switching element 30, the scan line 3a is electrically connected to a gate of the pixel switching element 30, and the pixel electrode 9a is electrically connected to a drain of the pixel switching element 30.

In the element substrate 10, the scan line drive circuit 104, the data line drive circuit 101, the sampling circuit 103, the inter-substrate conduction electrode 19, the terminal 102, and the like are configured in the outer peripheral region 10c of the outside of the pixel electrode arrangement region 10p. A plurality of wires extends from the terminals 102 toward the scan line drive circuit 104, the data line drive circuit 101, the sampling circuit 103, and the inter-substrate conduction electrode 19. The sampling circuit 103 is electrically connected to the plurality of the data lines 6a, and the scan line drive circuit 104 is connected to the plurality of scan lines 3a.

In each pixel 100a, the pixel electrode 9a opposes the common electrode 21 formed in the counter substrate 20 described with reference to FIG. 1, through the electro-optical layer 50, and configures a liquid crystal capacitor 50a. In addition, in each pixel 100a, in order to prevent a pixel signal stored in the liquid crystal capacitor 50a from varying, a storage capacitor 55 is added in parallel to the liquid crystal capacitor 50a. In the present embodiment, in order to configure the storage capacitor 55, a capacitor line 5a extending in parallel to the scan line 3a is formed across the plurality of pixels 100a, and a potential Vcom is applied to the capacitor line 5a. As the potential Vcom, the same potential as a common potential which is applied to the common electrode 21 can be used.

The terminals 102 provided along a side surface 10e of the element substrate 10 are configured by a plurality of terminal groups which is broadly classified into four purposes of a common potential line purpose, a scan line drive circuit purpose, a pixel signal purpose, and a data line drive circuit purpose. Specifically, the terminals 102 include a terminal TVcom for a common potential line LVcom, and include a terminal TSPY, a terminal TVSSY, a terminal TVDDY, a terminal TCLY, and a terminal $TCLY_{INV}$, for the scan line drive circuit 104. In addition, the terminals 102 include terminals TVID1 to TVID6 for pixel signals VID1 to VID6, and include a terminal TVSSX, a terminal TSPX, a terminal TVDDX, a terminal TCLX, a terminal TCLX$_{INV}$, terminals TENB1 to TENB4, and a terminal TVSSX, for the data line drive circuit 101.

The data line drive circuit 101 includes a shift register circuit 101c, a selection circuit 101b, and a buffer circuit 101a. In the data line drive circuit 101, the shift register circuit 101c uses as a power supply a positive power supply VDDX that supplies a negative power supply VSSX supplying a negative potential which is negative with respect to a reference potential (GND potential) and supplies a positive power supply VDDX supplying a positive potential which is positive with respect to the reference potential (GND potential), from an external control circuit through terminals 102 (terminals TVSSX and TVDDX) and constant potential line LVSSX and LVDDX, and starts a transfer operation based on a start signal SPX which is supplied through the terminals 102 (terminal TSPX) and a wire LSPX from an external control circuit. The shift register circuit 101c sequentially outputs transfer signals to the selection circuit 101b at a predetermined timing, based on a clock signal CLX and a reverse phase clock signal CLXINV which are supplied through the terminals 102 (terminals TCLX and TCLXINV) and wires LCLX and LCLXINV. The selection circuit 101b is referred to as an "enable circuit", and pulse widths of transfer signals which are sequentially output from the shift register circuit 101c are limited to pulse widths of enable signals ENB1 to ENB4 which are supplied from an external control circuit through the terminals 102 (terminals TENB1 to TENB4) and the wires LENB1 to LENB4, and thereby each sampling period of a sampling circuit 103 which will be described later is specified. More specifically, the selection circuit 101b is configured by NAND circuits, inverters, or the like which are provided in correspondence to each of the shift register circuits 101c, and a selection control of an image potential in a time axis is performed, such that the data lines 6a are driven only when transfer signals which are sequentially output from the shift register circuit 101c go to a high level and any one of the enable signals ENB1 to ENB4 go to a high level. The buffer circuit 101a performs buffering of the transfer signal in which a selection of an image potential is performed in this way, and thereafter, supplies the transfer signal to the sampling circuit 103 through a sampling circuit drive signal line 109 as a sampling circuit drive signal.

The sampling circuit 103 is configured to include a plurality of switching elements 108 for sampling an image signal. In the present embodiment, the switching element 108 is configured by a field effect transistor such as a TFT. The data line 6a is electrically connected to a drain of the switching element 108, image signal lines LVID1 to LVID6 are connected to a source of the switching element 108 through the wire 106, and the sampling circuit drive signal line 109 connected to the data line drive circuit 101 is connected to a gate of the switching element 108. Then, the image signals VID1 to VID6 which are supplied to the image signal lines LVID1 to LVID6 through the terminals 102 (terminals TVID1 to TVID6) are sampled by the sampling circuit 103, according to a sampling circuit drive signal which is supplied from the data line drive circuit 101 through the sampling circuit drive signal line 109, and are supplied to each data line 6a as image signals S1, S2, S3, . . . , Sn. In the present embodiment, the image signals S1, S2, S3, . . . , Sn are supplied for each group with respect to a set of six data lines 6a, in correspondence to each of the image signals VID1 to VID6 in which serial-parallel deployment is performed in six phases. A phase deployment of the image signal is not limited to six phases, and for example, image signals which are deployed in multiple phases such as nine phases, twelve phases, twenty-four phases, or forty-eight phases are supplied to a set of data lines 6a in which numbers corresponding to the number of the deployments are set as a set.

The scan line drive circuit 104 includes a shift register circuit and a buffer circuit as configuration elements. The scan line drive circuit 104 uses as a power supply the negative power supply VSSY and the positive power supply VDDY which are supplied from an external control circuit through the terminals 102 (terminals TVSSY and TVDDY) and the constant potential lines LVSSY and LVDDY, and starts a transfer operation of an embedded shift register, according to a start signal SPY which is supplied from the same external control circuit through the terminals 102 (terminal TSPY and terminal LSPY). In addition, the scan line drive circuit 104 applies the scan signal to the scan lines 3a in a pulsed manner and a line sequential manner at a predetermined timing, based on a clock signal CLY and a reverse phase clock signal CLY$_{INV}$ which are supplied through the terminals 102 (terminals TCLY and TCLY$_{INV}$, and the wires LCLY and LCLY$_{INV}$.

A common potential line LVcom is formed in the element substrate 10, so as to pass through four inter-substrate conduction electrodes 19, and the common potential Vcom is supplied to the inter-substrate conduction electrodes 19 through the terminals 102 (terminal TVcom) and a common potential line LVcom.

Basic Configuration of Pixel 100a

Figure 3A:
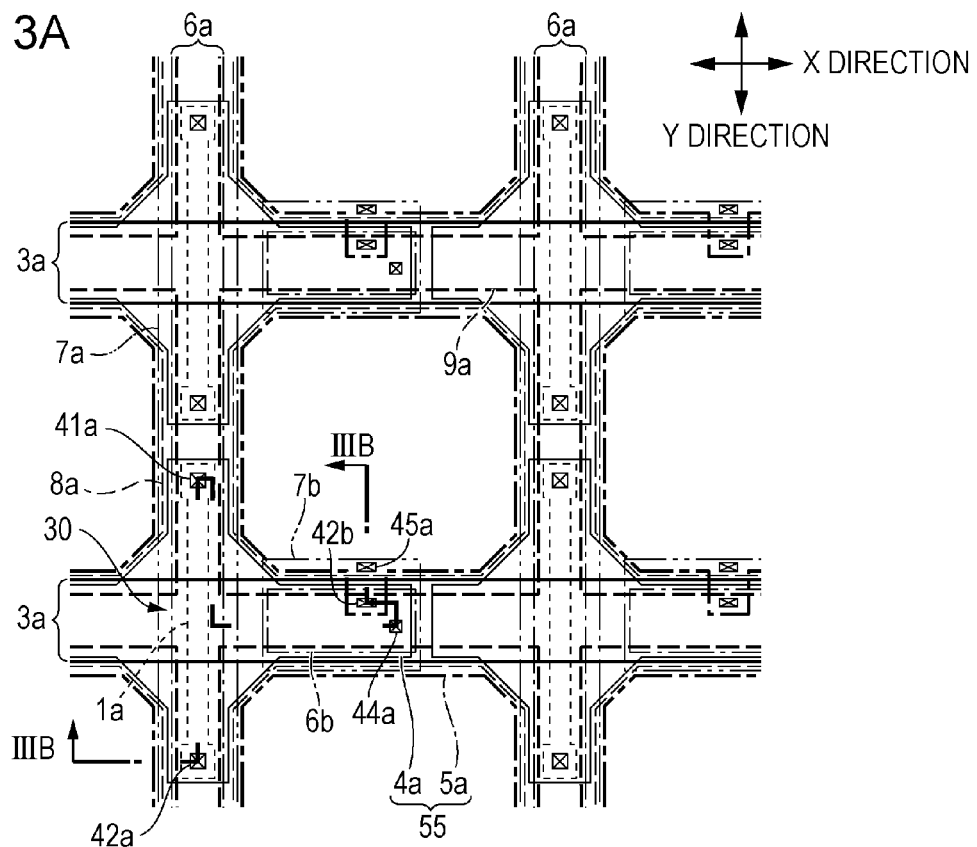
FIGS. 3A and 3B are explanatory diagrams illustrating a pixel of the electro-optical device according to Embodiment 1 of the invention.
Figure 3B:
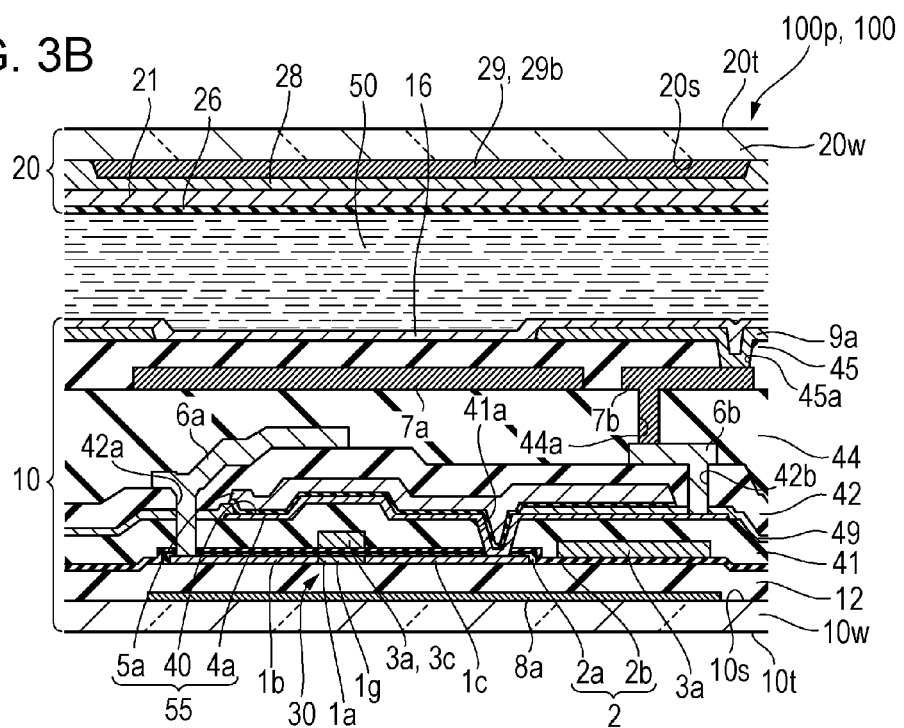

FIGS. 3A and 3B are explanatory diagrams of a pixel 100a of the electro-optical device 100 according to Embodiment 1 of the invention. FIG. 3A is a plan diagram of a plurality of pixels adjacent to each other in the element substrate 10, and FIG. 3B is a IIIB-IIIB cross-sectional diagram of the electro-optical device 100. In FIG. 3A, each layer is illustrated by the following lines.

lower layer side light shielding layer 8a=thin and long dashed line
semiconductor layer 1a=thin and short dotted line
scan line 3a=thick solid line
drain electrode 4a=thin solid line
data line 6a and relay electrode 6b=thin one-dotted chain line
capacitor line 5a=thick one-dotted chain line
upper layer side light shielding layer 7a and the relay electrode 7b=thin two-dotted chain line
pixel electrode 9a=thick dashed line In addition, in FIG. 3A, end portions are shifted so as to easily understand the shape of a layer, with regard to the layers in which end portions overlap each other in a plan view.

As illustrated in FIG. 3A, in the element substrate 10, the pixel electrodes 9a are formed in each of the plurality of pixels 100a on the one surface 10s opposing the counter substrate 20, and the data line 6a and the scan line 3a are formed along an inter-pixel area interposed between the pixel electrodes 9a adjacent to each other. In the present embodiment, the inter-pixel area extends in a vertical axis, the scan line 3a linearly extends along a first inter-pixel area extending in the X direction among the inter-pixel areas, and the data line 6a linearly extends along a second inter-pixel area extending in the Y direction. In addition, the pixel switching element 30 is formed in correspondence to the intersection between the data line 6a and the scan line 3a, and in the present embodiment, the pixel switching element 30 is formed using the intersection area between the data line 6a and the scan line 3a, and using a periphery thereof. The capacitor line 5a is formed in the element substrate 10, and the common potential Vcom is applied to the capacitor line 5a. In the present embodiment, the capacitor line 5a is formed in a lattice pattern and extends so as to overlap the scan line 3a and the data line 6a. On an upper layer side of the pixel switching element 30, the upper layer side light shielding layer 7a is formed, and the upper layer side light shielding layer 7a extends so as to overlap the data line 6a and the scan line 3a. On the lower layer side of the pixel switching element 30, the lower layer side light shielding layer 8a is formed, and the lower layer side light shielding layer 8a extends so as to overlap the scan line 3a and the data line 6a.

As illustrated in FIG. 3B, in the element substrate 10, a substrate body is configured by a light transmitting substrate 10w, such as a quartz substrate or a glass substrate, and the pixel electrode 9a, the pixel switching element 30 for pixel switching, the orientation film 16, and the like which will be described later are formed on a surface (one surface 10s side opposing the counter substrate 20) of the electro-optical layer 50 side of the light transmitting substrate 10w. In addition, a substrate body of the counter substrate 20 is formed by the light transmitting substrate 20w, such as a quartz substrate or a glass substrate, and the light shielding layer 29, the common electrode 21, the orientation film 26, and the like are formed on a surface (one surface 20s opposing element substrate 10) of the electro-optical layer 50 of a light transmitting substrate 20w.

In the element substrate 10, a lower layer side light shielding layer 8a which is formed of a conductive film, such as a conductive silicon film, a metal silicide film, a metal film, or a metal compound film is formed on the one surface 10s side of the light transmitting substrate 10w. In the present embodiment, the lower layer side light shielding layer 8a is formed of a light shielding film such as tungsten silicide (WSi), tungsten, or titanium nitride, and prevents the pixel switching element 30 from malfunctioning due to a photocurrent which is cause by the light incident into the semiconductor layer 1a, when light that passes through the electro-optical device 100 is reflected by other members. There is a case in which the lower layer side light shielding layer 8a is configured as a scan line, and in this case, a gate electrode 3c and the lower layer side light shielding layer 8a are electrically connected to each other. In the present embodiment, the lower layer side light shielding layer 8a is formed of tungsten silicide.

On the one surface 10s side of the light transmitting substrate 10w, a light transmitting insulating film 12 formed of a silicon oxide film is formed on an upper layer side of the lower layer side light shielding layer 8a, and the pixel switching element 30 including a semiconductor layer 1a is formed on a surface side of the insulating film 12. The pixel switching element 30 includes the semiconductor layer 1a facing a long side direction in an extending direction of the data line 6a, and the gate electrode 3c which extends in s direction intersecting a length direction of the semiconductor layer 1a and which overlaps a central portion in a length direction of the semiconductor layer 1a, and in the present embodiment, the gate electrode 3c is configured by a portion of the scan line 3a. The pixel switching element 30 includes a light transmitting gate insulating layer 2 between the semiconductor layer 1a and the gate electrode 3c. The semiconductor layer 1a includes a channel region 1g facing the gate electrode 3c through the gate insulating layer 2, and includes the source region 1b and a drain region 1c on both sides of the channel region 1g. In the present embodiment, the pixel switching element 30 has an LDD structure. Thus, each of the source region 1b and the drain region 1c includes a low concentration region on both sided of the channel region 1g, and includes a high concentration region in an area adjacent to an opposite side of the channel region 1g, with respect to the low concentration region.

The semiconductor layer 1a is configured by a polysilicon film (polycrystalline silicon film) or the like. The gate insulating layer 2 is formed by two layer structure of a first gate insulating layer 2a that is formed of a silicon oxide film in which the semiconductor layer 1a is thermally oxidized, and a second insulating layer 2b that is formed of a silicon oxide film formed using a low pressure CVD method at a high temperature in conditions of 700° C. to 900° C. The gate electrode 3c and a scan line 3a are formed of a conductive polysilicon film, a metal silicide film, a metal film, a metal compound film, or the like. In the present embodiment, the gate electrode 3c includes a two-layer structure of a conductive polysilicon film and a tungsten silicide film.

A light transmitting interlayer insulating film 41 formed of a silicon oxide film such as an NSG, a PSG, a BSG or a BPSG, or the like is formed on an upper layer side of the gate electrode 3c, and a drain electrode 4a is formed on an upper layer of the interlayer insulating layer 41. In the present embodiment, the interlayer insulating layer 41 is formed of a silicon oxide film. The drain electrode 4a is formed of a conductive polysilicon film, a metal silicide film, a metal film, a metal compound film, or the like. In the present embodiment, the drain electrode 4a is formed of a polysilicon film. The drain electrode 4a is formed such that a portion of the drain electrode overlaps the drain region 1c (source-drain region on pixel electrode side) of the semiconductor layer 1a, and is electrically connected to the drain region 1c through a contact hole 41a passing through the interlayer insulating layer 41 and the gate insulating layer 2.

A light transmitting etching stopper layer 49 and a light transmitting dielectric layer 40 which are formed of a silicon oxide film or the like are formed on an upper layer side of the drain electrode 4a, and the capacitor line 5a is formed on an upper layer side of the dielectric layer 40. As the dielectric layer 40, a silicon compound, such as a silicon oxide film or a silicon nitride film can be used, and a dielectric layer with a high dielectric constant, such as an aluminum oxide film, a titanium oxide film, a tantalum oxide film, a niobium oxide film, a hafnium oxide film, a lanthanum oxide film, or a zirconium oxide film can be used. The capacitor line 5a is formed of a conductive film, such as a conductive polysilicon film, a metal silicide film, a metal film, or a metal compound film. In the present embodiment, the capacitor line 5a includes a three-layer structure of a titanium nitride film, an aluminum film, and a titanium nitride film. Here, the capacitor line 5a overlaps the drain electrode 4a through the dielectric layer 40, and configures the storage capacitor 55.

An interlayer insulating film 42 is formed on an upper layer side of the capacitor line 5a, and the data line 6a and a relay electrode 6b are formed by the same conductive film on an upper layer side of the interlayer insulating film. The interlayer insulating film 42 is formed of a silicon oxide film 42. The data line 6a and the relay electrode 6b are formed of a conductive film, such as a conductive polysilicon film, a metal silicide film, a metal film, or a metal compound film. In the present embodiment, the data line 6a and the relay electrode 6b are formed of a laminated film of two layers to four layers, in which a titanium film or a titanium nitride film and aluminum film are laminated. The data line 6a is electrically connected to a source region 1b (source-drain region on data line side) through a contact hole 42a which passes through the interlayer insulating film 42, the etching stopper layer 49, the interlayer insulating layer 41, and the gate insulating layer 2. The relay electrode 6b is electrically connected to the drain electrode 4a through a contact hole 42b which passes through the interlayer insulating film 42 and the etching stopper layer 49.

A light transmitting interlayer insulating film 44 which is formed of a silicon oxide film or the like is formed on an upper layer side of the data line 6a and the relay electrode 6b, and an upper layer side light shielding layer 7a and a relay electrode 7b are formed by the same conductive film, on an upper layer side of the interlayer insulating film 44. The interlayer insulating film 44 is formed of a silicon oxide film formed using, for example, a plasma CVD method which uses tetraethoxysilane and oxygen gas, or a plasma CVD method which uses silane gas and nitrous oxide gas, and a surface thereof is planarized. The upper layer side light shielding layer 7a and the relay electrode 7b are formed of a conductive film, such as a conductive polysilicon film, a metal silicide film, a metal film, a metal compound film, or the like. In the present embodiment, the upper layer side light shielding layer 7a and the relay electrode 7b are formed of a laminated film of two layers to four layers, in which a titanium film or a titanium nitride film and aluminum film are laminated. The relay electrode 7b is electrically connected to the relay electrode 6b through the contact hole 44a which passes through the interlayer insulating film 44. The upper layer side light shielding layer 7a extends so as to overlap the data line 6a, and functions as a light shield layer. The upper layer side light shielding layer 7a is electrically connected to the capacitor line 5a, and thereby the upper layer side light shielding layer 7a may be used as a shield layer.

A light transmitting interlayer insulating film 45 which is formed of a silicon oxide film or the like is formed on an upper layer side of the upper layer side light shielding layer 7a and the relay electrode 7b, and the pixel electrode 9a which is formed of an ITO film or the like is formed on an upper layer side of the interlayer insulating film 45. A contact hole 45a which passes through the interlayer insulating film 45 and reaches the relay electrode 7b is formed on the interlayer insulating film 45, and the pixel electrode 9a is electrically connected to the relay electrode 7b through the contact hole 45a. As a result, a pixel electrode 9a is electrically connected to the drain region 1c through the relay electrode 7b, the relay electrode 6b, and the drain electrode 4a. The interlayer insulating film 45 is formed of a silicon oxide film formed using, for example, a plasma CVD method which uses tetraethoxysilane and oxygen gas, or a plasma CVD method which uses silane gas and nitrous oxide gas. In addition, there is a case in which the interlayer insulating film 45 includes a structure of a first insulating film on a lower layer side formed of non-silicate gas (NSG) and a second insulating film on an upper layer side formed of boron silicate glass (BSG). In any case, a surface of the interlayer insulating film 45 is planarized.

The orientation film 16 formed of polyimide or inorganic orientation film is formed on a surface side of the pixel electrode 9a. In the present embodiment, the orientation film 16 is formed of an oblique deposition film (tilted vertical orientation film/inorganic orientation film) such as SiOx (x<2), $SiO_2$, $TiO_2$, MgO, $Al_2O_3$, $In_2O_3$, $Sb_2O_3$, or $Ta_2O_5$.

Configuration of Counter Substrate 20

In the counter substrate 20, the light shielding layer 29, an insulating film 28 formed of a silicon oxide film or the like, and the common electrode 21 formed of a light transmitting conductive film such as an ITO film, are formed on a surface (the other surface 20s opposing the element substrate 10) of the electro-optical layer 50 side of the light transmitting substrate 20w, such as a quartz substrate or a glass substrate, and the orientation film 26 formed of polyimide or inorganic orientation film is formed so as to cover the common electrode 21. In the present embodiment, the common electrode 21 is formed of an ITO film. In the present embodiment, the orientation film 26 is formed of an oblique deposition film (tilted vertical orientation film/inorganic orientation film), such as, SiOx (x<2), $SiO_2$, $TiO_2$, MgO, $Al_2O_3$, $In_2O_3$, $Sb_2O_3$, or $Ta_2O_5$, in the same manner as the orientation film 16. In the orientation films 16 and 26, dielectric anisotropy which is used for the electro-optical layer 50 performs a tilted vertical orientation of negative nematic liquid crystal compound, and the liquid crystal panel 100p operates as a normally black VA mode. In the present embodiment, an oblique deposition film of a silicon oxide film ($SiO_x$), among various inorganic orientation films is used as the orientation films 16 and 26.

Configuration of Electrostatic Protection Circuit 105

Figure 4A:
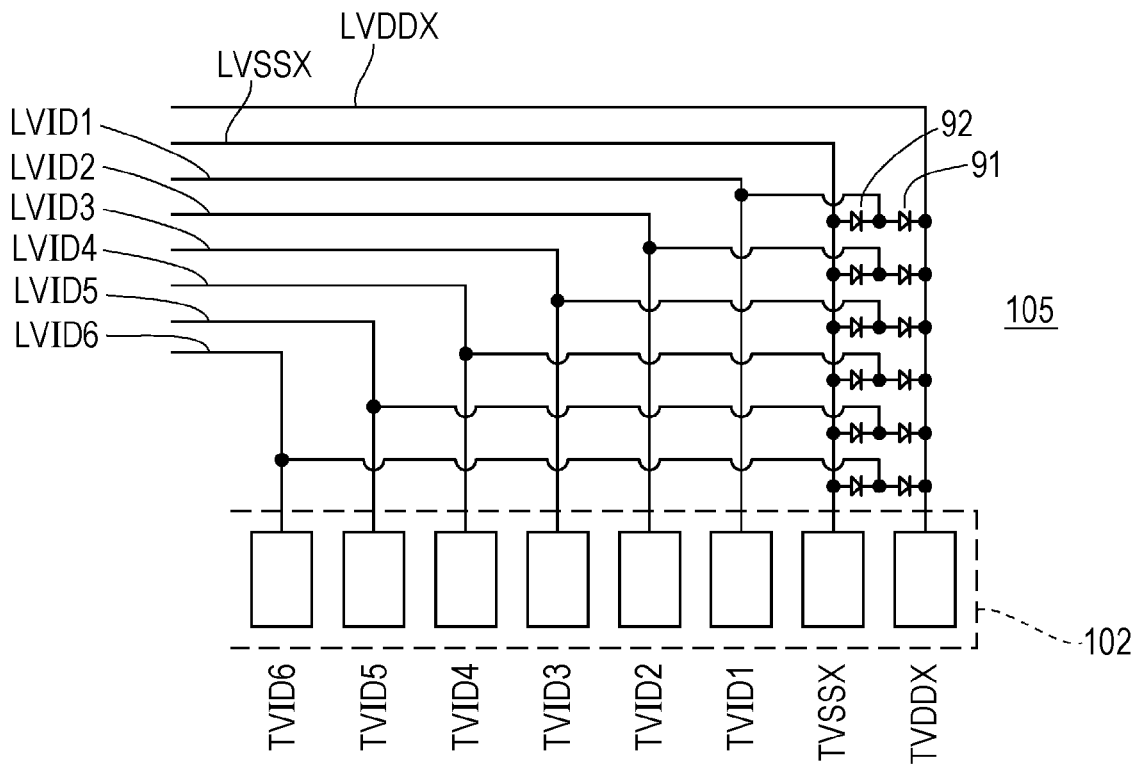
FIGS. 4A and 4B are explanatory diagrams of an electrostatic protection circuit provided in the electro-optical device according to Embodiment 1 of the invention.
Figure 4B:
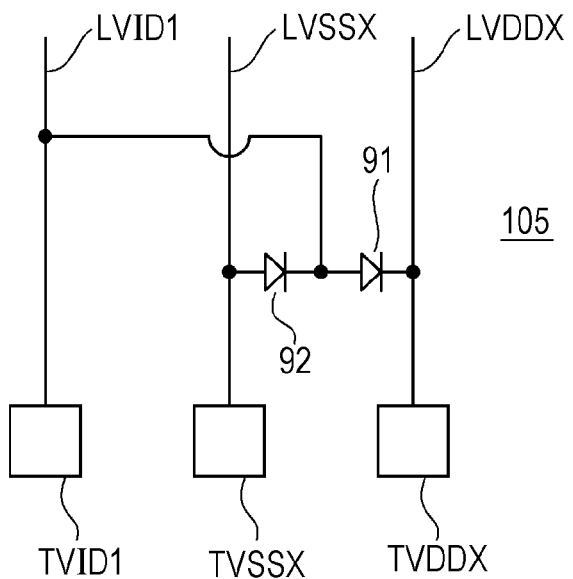

FIGS. 4A and 4B are explanatory diagrams of an electrostatic protection circuit provided in the electro-optical device 100 according to Embodiment 1 of the invention.

In the electro-optical device 100 according to the present embodiment, as illustrated in FIG. 2A, an electrostatic protection circuit 105 is provided with respect to the image signal lines LVID1 to LVID6 to which the image signals VID1 to VID6 configured by analog signals, using an area or the like interposed between the terminals 102 and the data line drive circuit 101.

More specifically, as illustrated in FIGS. 4A and 4B, in the electro-optical device 100 of the present embodiment, the constant potential lines LVSSX and LVDDX extend in the periphery of the image signal lines LVID1 to LVID6. Among the constant potential lines LVSSX and LVDDX, the constant potential line LVSSX is a low potential line to which a low potential of, for example, 0 V is supplied, and potentials lower than the image signals VID1 to VID6 which are supplied to the constant potential lines LVSSX and LVDDX is supplied. In contrast to this, the constant potential line LVDDX is a high potential line to which a high potential of, for example, 15.5 V is supplied, and potentials higher than the image signals VID1 to VID6 which are supplied to the constant potential lines LVSSX and LVDDX are supplied. However, in the present embodiment, the electrostatic protection circuit 105 is configured using the constant potential lines LVSSX and LVDDX.

More specifically, in the electrostatic protection circuit 105, a first electrostatic protection element 91 is connected between the image signal line LVID1 and the constant potential line LVDDX, and a second electrostatic protection element 92 is connected between the image signal line LVID1 and the constant potential line LVSSX.

Here, the first electrostatic protection element 91 and the second electrostatic protection element 92 function as diodes. In addition, the first electrostatic protection element 91 includes an anode connected to the image signal line LVID1, and a cathode connected to constant potential line LVDDX (high potential line). In addition, the second electrostatic protection element 92 includes an anode connected to the constant potential line LVSSX (low potential line), and a cathode connected to the image signal line LVID1. For this reason, the first electrostatic protection element 91 and the second electrostatic protection element 92 are all in a state of being reverse-biased in normal time. Thus, there is no leakage of a signal from the image signal line LVID1 to the constant potential line LVSSX and LVDDX. In addition, in the manufacturing process, when static electricity is input from a connection terminal TVID1 of the image signal line LVID1, it is possible to make the electricity escape into the constant potential lines LVSSX and LVDDX through the first electrostatic protection element 91 and the second electrostatic protection element 92. Since this configuration is also applied to the other image signal lines LVID2 to LVID6 in the same manner, description thereof will be omitted.

Detailed Configuration of Electrostatic Protection Circuit 105

Figure 5:
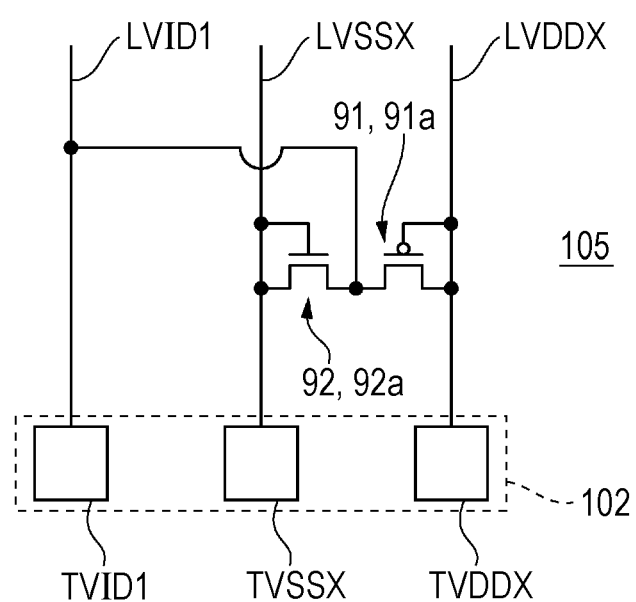
FIG. 5 is an explanatory diagram illustrating a specific configuration example of the electrostatic protection circuit provided in the electro-optical device according to Embodiment 1 of the invention.
Figure 6A:
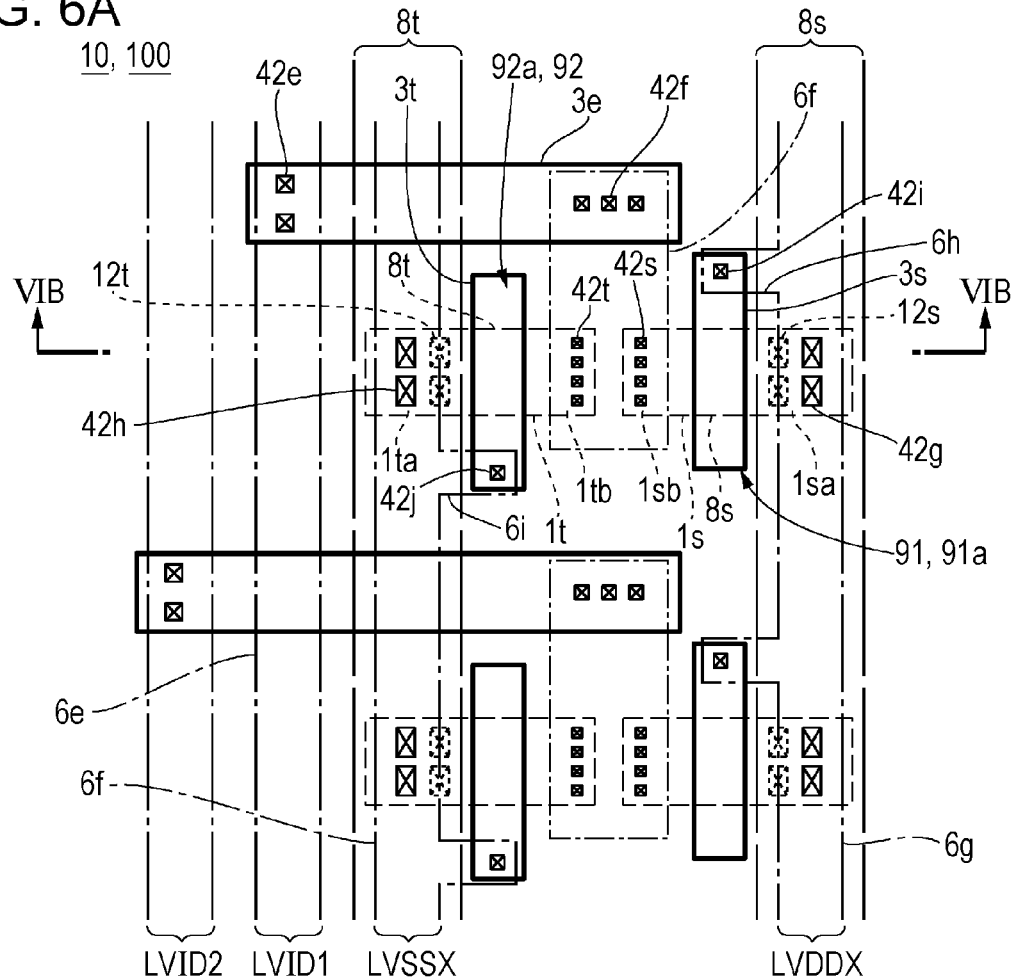
FIGS. 6A and 6B are explanatory diagrams illustrating a specific configuration example of an electrostatic protection element provided in the electro-optical device according to Embodiment 1 of the invention.
Figure 6B:
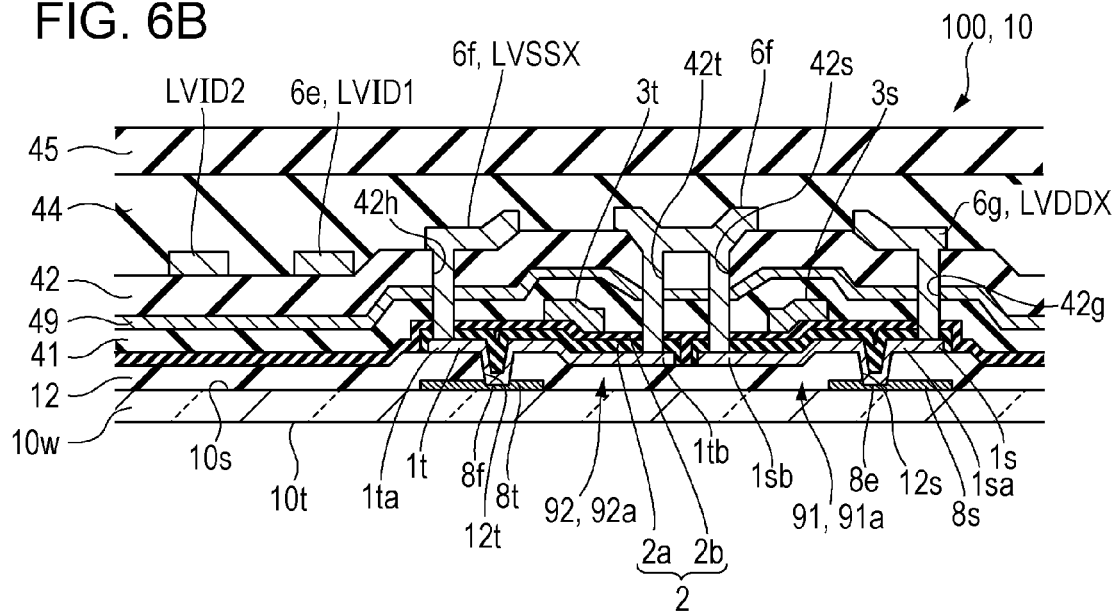
Figure 7:
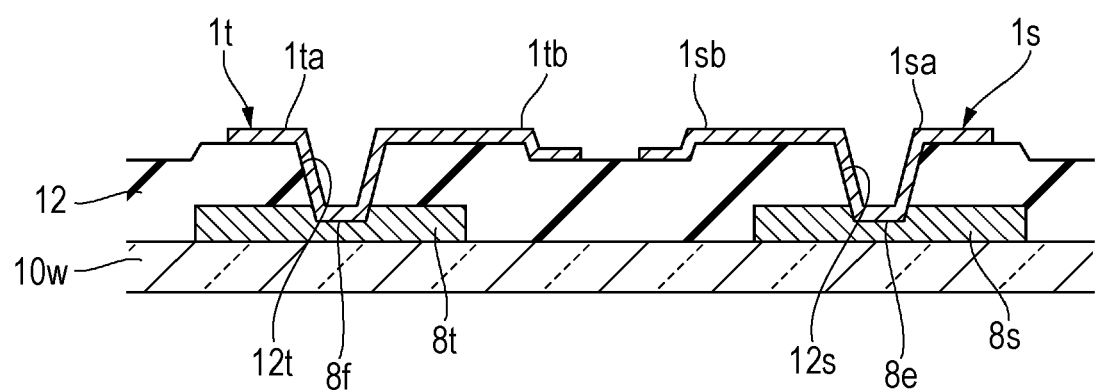
FIG. 7 is an explanatory diagram illustrating by enlarging a connection portion of a semiconductor film for the electrostatic protection element, and a heat dissipation layer, in the electro-optical device according to Embodiment 1 of the invention.

FIG. 5 is an explanatory diagram illustrating a specific configuration example of the electrostatic protection circuit provided in the electro-optical device 100 according to Embodiment 1 of the invention. FIGS. 6A and 6B are explanatory diagrams illustrating a specific configuration example of an electrostatic protection element provided in the electro-optical device 100 according to Embodiment 1 of the invention, and FIG. 6A is a plan diagram of the electrostatic protection element and FIG. 6B is a cross-sectional diagram. FIG. 7 is an explanatory diagram illustrating by enlarging a connection portion of a semiconductor film for the electrostatic protection element, and a heat dissipation layer, in the electro-optical device 100 according to Embodiment 1 of the invention.

As illustrated in FIG. 5, in the present embodiment, when configuring the electrostatic protection circuit 105, the first electrostatic protection element 91 and the second electrostatic protection element 92 are all configured by diode-connected MOS transistors 91a and 92a. More specifically, the first electrostatic protection element 91 is a p channel MOS transistor 91a, a gate and a drain thereof are electrically connected to each other, the gate and the drain are electrically connected to the constant potential line LVDDX (high potential line), and a source is electrically connected to the image signal line LVID1. The second electrostatic protection element 92 is an n channel MOS transistor 92a, a gate and a drain thereof are electrically connected to each other, the gate and the drain are electrically connected to the constant potential line LVSSX (low potential line), and a source is electrically connected to the image signal line LVID1. Since this configuration is also applied to the other image signal lines LVID2 to LVID6 in the same manner, description thereof will be omitted.

The MOS transistors 91a and 92a are configured by a conductive film that configures the semiconductor layer 1a, the scan line 3a, and the data line 6a, which are described with reference to FIGS. 3A and 3B. Hereinafter, a case will be described in which the constant potential lines LVSSX and LVDDX and the image signal lines LVID1 to LVID6 are configured by a conductive film that is formed in the same layer as that of the data line 6a, with reference to FIGS. 6A and 6B. Also in a case in which the constant potential lines LVSSX and LVDDX and the image signal lines LVID1 to LVID6 are formed in the same layer as that of the scan line 3a, the MOS transistors 91a and 92a can be configured using approximately the same structure. Hereinafter, the following description will be made with reference to FIGS. 3A and 3B.

In the present embodiment, as illustrated in FIGS. 6A and 6B, the image signal line LVID1 is configured by a conductive film 6e which is formed in the same layer as that of the data line 6a, the constant potential line LVSSX is formed by a conductive film 6f which is formed in the same layer as that of the data line 6a, and the constant potential line LVDDX is formed by a conductive film 6g which is formed in the same layer as that of the data line 6a. In addition, the MOS transistors 91a and 92a are configured between the constant potential line LVSSX and the constant potential line LVDDX. For this reason, on the one surface 10s side of the element substrate 10, a conductive film 3e which extends from a position overlapping the image signal line LVID1 up to between the constant potential line LVSSX and the constant potential line LVDDX, and the conductive film 6f which extends from a position overlapping the conductive film 3e up to between the constant potential line LVSSX and the constant potential line LVDDX, are formed. Here, the conductive film 3e is a conductive film which is formed in the same layer as that of the scan line 3a, and the conductive film 6f is a conductive film which is formed in the same layer as that of the data line 6a. For this reason, the image signal line LVID1 and the conductive film 3e are electrically connected to each other through a contact hole 42e which passes through the interlayer insulating film 42, and the conductive film 3e and the conductive film 6f are electrically connected to each other through a contact hole 42f which passes through the interlayer insulating film 42. In addition, a convex portion 6i which protrudes toward the constant potential line LVDDX is formed on the constant potential line LVSSX, and a convex portion 6h which protrudes toward the constant potential line LVSSX is formed on the constant potential line LVDDX.

A first semiconductor layer 1s which extends from a position overlapping the constant potential line LVDDX to a position overlapping the conductive film 6f, and a second semiconductor layer 1t which extends from a position overlapping the constant potential line LVSSX to a position overlapping the conductive film 6f, are formed on the one surface 10s side of the element substrate 10, and the first semiconductor layer 1s and the second semiconductor layer 1t are configured by a silicon film formed in the same layer as the semiconductor layer 1a.

In addition, on the one surface 10s side of the element substrate 10, a first gate electrode 3s intersecting the periphery of the center of the first semiconductor layer is between the constant potential line LVDDX and the conductive film 6f is formed, and a second gate electrode 3t intersecting the periphery of the center of the second semiconductor layer 1t between the constant potential line LVSSX and the conductive film 6f is formed. The first gate electrode 3s and the second gate electrode 3t are formed in the same layer as that of the scan line 3a. P type impurity is introduced in a self-aligned manner to the first gate electrode 3s in the first semiconductor layer 1s, and a drain region 1sa and a source region 1sb are formed by an area in which the impurity is introduced. n type impurity is introduced in a self-aligned manner to the second gate electrode 3t in the second semiconductor layer 1t, and a drain region 1ta and a source region 1tb are formed by an area in which the impurity is introduced.

The constant potential line LVDDX is electrically connected to the drain region 1sa of the first semiconductor layer 1s through a contact hole 42g which passes though the interlayer insulating film 42 or the like, and a convex portion 6h of the constant potential line LVDDX is electrically connected to a first gate electrode 3s through a contact hole 42i which passes though the interlayer insulating film 42 or the like. In addition, the conductive film 6f is electrically connected to the source region 1sb of the first semiconductor layer 1s through a contact hole 42s which passes through the interlayer insulating film 42 or the like. The constant potential line LVSSX is electrically connected to the drain region 1ta of the second semiconductor layer 1t through a contact hole 42h which passes through the interlayer insulating film 42 or the like, and a convex portion 6*i* of the constant potential line LVSSX is electrically connected to a second gate electrode 3*t* through a contact hole 42*j* which passes though the interlayer insulating film 42 or the like. In addition, the conductive film 6*f* is electrically connected to the source region 1*tb* of the second semiconductor layer 1*t* through a contact hole 42*t* which passes through the interlayer insulating film 42 or the like. By doing this, the diode-connected MOS transistors 91*a* and 92*a* are configured on an opposite side to the light transmitting substrate 10*w*, with respect to the insulating film 12.

Configuration of Heat Dissipation Layer 8*s* and 8*t*

In the electro-optical device 100 configured in this way, a heat dissipation layer 8*s* which overlaps the drain region 1*sa* of the MOS transistor 91*a* in a plan view and a heat dissipation layer 8*t* which overlaps the drain region 1*ta* of the MOS transistor 92*a* in a plan view are formed between the light transmitting substrate 10*w* and the insulating film 12. The heat dissipation layers 8*s* and 8*t* are configured by a conductive film formed in the same layer as the lower layer side light shielding layer 8*a*, and are configured by the same material as that of the lower layer side light shielding layer 8*a*. In the present embodiment, the lower layer side light shielding layer 8*a* and the heat dissipation layers 8*s* and 8*t* are formed of tungsten silicide. The heat dissipation layer 8*s* does not overlap the first gate electrode 3*s* in a plan view, and the heat dissipation layer 8*ts* does not overlap the second gate electrode 3*t* in a plan view.

Here, the heat dissipation layer 8*s* is connected to the drain region 1*sa* of the MOS transistor 91*a* through the contact hole 12*s* formed in the insulating layer 12, and the heat dissipation layer 8*t* is connected to the drain region 1*ta* of the MOS transistor 92*a* through the contact hole 12*t* formed in the insulating layer 12. In the present embodiment, when the contact holes 12*s* and 12*t* are formed, the surfaces of the heat dissipation layers 8*s* and 8*t* are also etched at the bottom.

For this reason, as illustrated in FIG. 7, on the surface of the heat dissipation layer 8*s*, a concave portion 8*e* is formed in the bottom of the contact hole 12*s*, and the drain region 1*sa* of the MOS transistor 91*a* is in contact with the heat dissipation layer 8*s* in the bottom and side surface of the concave portion 8*e*. In addition, on the surface of the heat dissipation layer 8*t*, a concave portion 8*f* is formed in the bottom of the contact hole 12*t*, and the drain region 1*ta* of the MOS transistor 92*a* is in contact with the heat dissipation layer 8*t* in the bottom and side surface of the concave portion 8*f*.

Since this configuration is also applied to the other image signal lines LVID2 to LVID6 in the same manner, description thereof will be omitted. Here, the MOS transistors 91*a* and 92*a* are also formed in all the plurality of image signal lines LVID1 to LVID6, and the heat dissipation layers 8*s* and 8*t* are also formed with respect to all the MOS transistor 91*a* and 92*a*. In the present embodiment, the heat dissipation layers 8*s* and 8*t* extend in a strip shape between the constant potential line LVSSX and the constant potential line LVDDX, and the heat dissipation layers 8*s* and the heat dissipation layers 8*t* which are provided with respect to the plurality of image signal lines LVID1 to LVID6 are continuously connected. In addition, the heat dissipation layer 8*s* is connected to the heat dissipation layer 8*t* in end portions of the heat dissipation layers 8*s* and 8*t*.

Main Effect of Present Embodiment

As described above, in the present embodiment, MOS transistors 91*a* and 92*a* (electrostatic protection elements) are provided on an opposite side to the light transmitting substrate 10*w* with respect to the insulating film 12, and the heat dissipation layers 8*s* and 8*t* which overlap the drain regions 1*sa* and 1*ta* of the MOS transistors 91*a* and 92*a* in a plan view are provided between the light transmitting substrate 10*w* and the insulating film 12. In addition, the heat dissipation layers 8*s* and 8*t* are connected to the drain regions 1*sa* and 1*ta* through the contact holes 12*s* and 12*t* formed in the insulating film 12. For this reason, when the static electricity input to the image signal lines LVID1 to LVID6 from the terminals TVID1 to TVID6 is released through the MOS transistors 91*a* and 92*a*, even if a large current flows through the drain regions 1*sa* and 1*ta* of the MOS transistors 91*a* and 92*a*, and thereby heat is generated, it is possible to make the heat escape into the heat dissipation layers 8*s* and 8*t* through the contact holes 12*s* and 12*t*. Thus, even if the MOS transistors 91*a* and 92*a* (electrostatic protection elements) are formed on the insulating film 12, it is possible to reduce a loss due to heat generated in the MOS transistors 91*a* and 92*a*. In addition, even if a quartz substrate or a glass substrate with a low heat dissipation is used as the light transmitting substrate 10*w*, and an upper layer side is covered with the insulating film 12 having a low heat dissipation, it is possible to reduce a loss due to heat generated in the MOS transistors 91*a* and 92*a*. Furthermore, the first semiconductor layer 1*s* and the second semiconductor layer 1*t* are thin film formed in the light transmitting substrate 10*w*, but the heat escapes into the heat dissipation layers 8*s* and 8*t*, and thus even when the MOS transistors 91*a* and 92*a* are formed by the first semiconductor layer 1*s* and the second semiconductor layer 1*t* which are thin, it is possible to reduce the heat generated in the MOS transistors 91*a* and 92*a*.

In addition, in the heat dissipation layers 8*s* and 8*t*, since the bottoms of the contact holes 12*s* and 12*t* are configured by the concave portion 8*e* and 8*f*, a contact area of the drain regions 1*sa* and 1*ta*, and the heat dissipation layers 8*s* and 8*t* can be widened. Thus, even if heat is generated in the drain regions 1*sa* and 1*ta*, it is possible to efficiently make the heat escape into the heat dissipation layers 8*s* and 8*t* through the contact holes 12*s* and 12*t*.

In addition, since the heat dissipation layers 8*s* and 8*t* are configured by conductive films, it is also possible to make a portion of a current flowing through the drain regions 1*sa* and 1*ta* escape into the heat dissipation layers 8*s* and 8*t*. Thus, since the heat generated in the drain regions 1*sa* and 1*ta* can be reduced, it is possible to reduce a loss due to heat generated in the MOS transistors 91*a* and 92*a*.

In addition, the heat dissipation layers 8*s* and 8*t* do not overlap the gate electrodes 3*s* and 3*t* of the MOS transistors 91*a* and 92*a*. For this reason, it is possible to prevent the MOS transistors 91*a* and 92*a* from malfunctioning due to a potential change of the heat dissipation layers 8*s* and 8*t*.

In addition, since the heat dissipation layers 8*s* and 8*t* are formed in the same layer as the lower layer side light shielding layer 8*a*, the heat dissipation layers 8*s* and 8*t* can be simultaneously formed.

In addition, since the heat dissipation layers 8*s* and 8*t* provided with respect to the plurality of image signal lines LVID1 to LVID6 are continuously formed in a wide area, it is easy to make the heat generated in the drain regions 1*sa* and 1*ta* escape into the heat dissipation layer.

Embodiment 2

Detailed Configuration of Electrostatic Protection Circuit 105

Figure 8A:
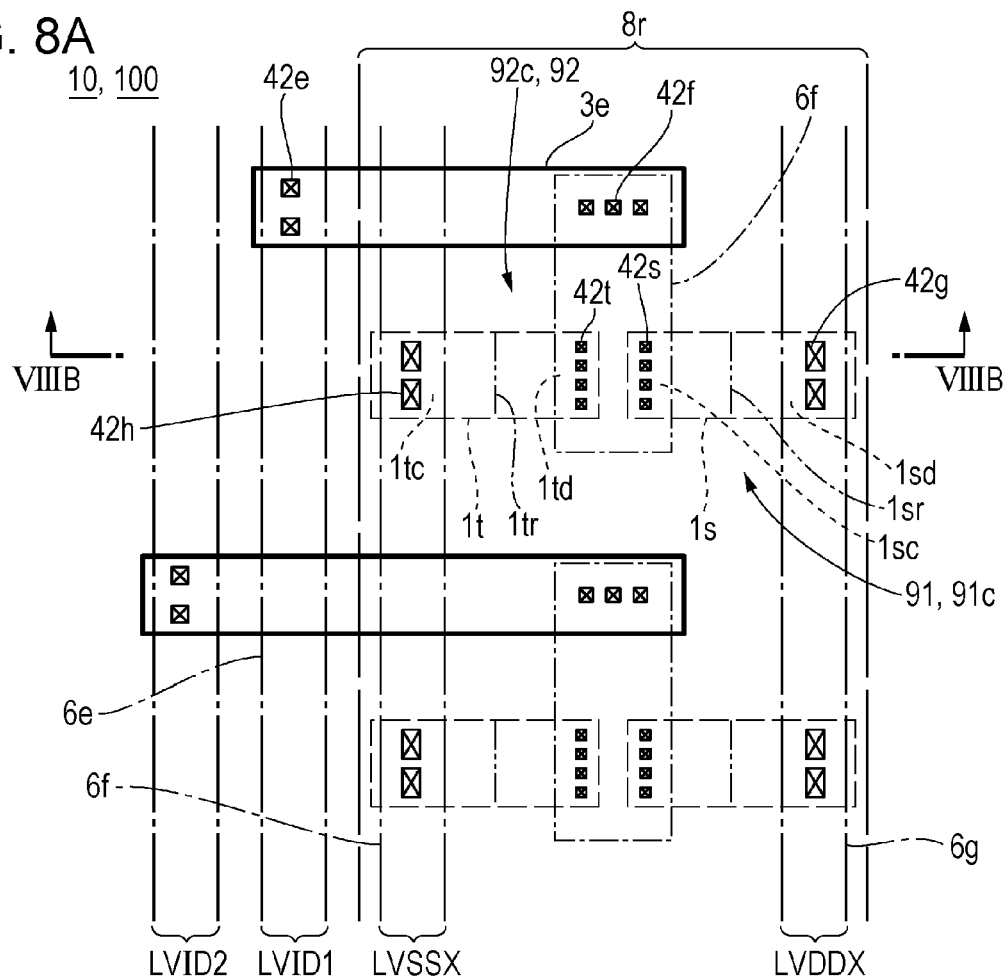
FIGS. 8A and 8B are explanatory diagrams illustrating a specific configuration example of an electrostatic protection element provided in an electro-optical device according to Embodiment 2 of the invention.
Figure 8B:
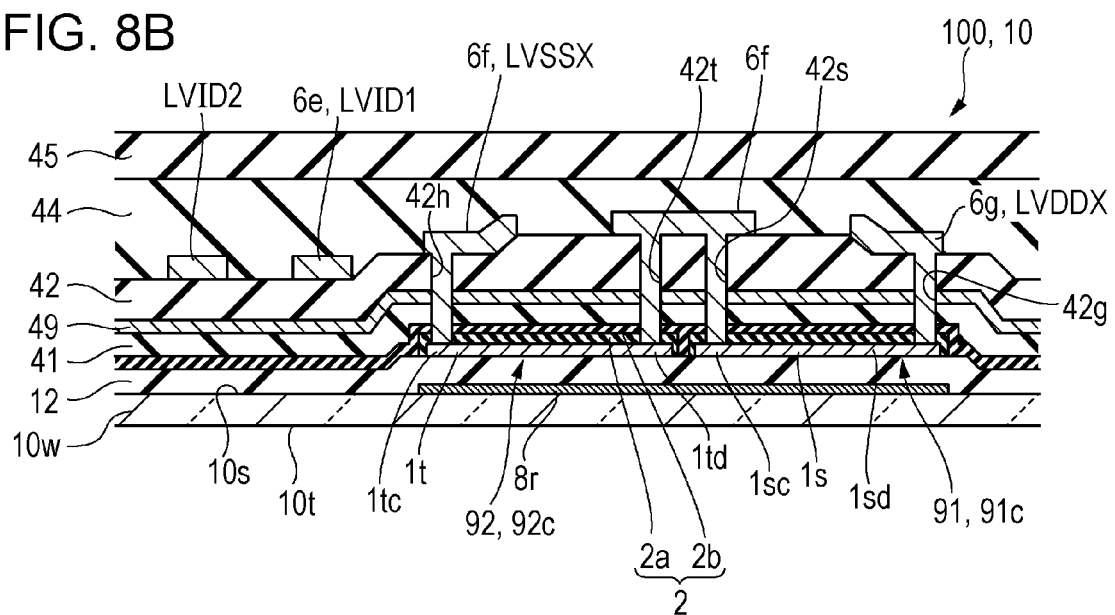

FIGS. 8A and 8B are explanatory diagrams illustrating a specific configuration example of an electrostatic protection element provided in an electro-optical device 100 according to Embodiment 2 of the invention. FIG. 8A is a plan diagram of an electrostatic protection element and FIG. 8B is a cross-sectional diagram. In addition, in the present embodiment, the same symbols or reference numerals are attached to the same portions as those of Embodiment 1.

As illustrated in FIGS. 8A and 8B, in the present embodiment, when configuring the electrostatic protection circuit 105, electrostatic protection elements 91 and 92 are all configured by pn junction diode elements 91c and 92c. The diode elements 91c and 92c are configured by the semiconductor layer 1a which is described with reference to FIGS. 3A and 3B, or by a conductive film which configures the scan line 3a or the data line 6a.

In the present embodiment, the image signal lines LVID1 is configured by the conductive film 6e which is formed in the same layer as that of the data line 6a, the constant potential line LVSSX is configured by the conductive film 6f which is formed in the same layer as that of the data line 6a, and the constant potential line LVDDX is configured by the conductive film 6g which is formed in the same layer as that of the data line 6a. In addition, the diode elements 91c and 92c are configured between the constant potential line LVSSX and the constant potential line LVDDX. For this reason, on the one surface 10s side of the element substrate 10, the conductive film 3e which extends from a position overlapping the image signal line LVID1 up to between the constant potential line LVSSX and the constant potential line LVDDX, and the conductive film 6f which extends from a position overlapping the conductive film 3e up to between the constant potential line LVSSX and the constant potential line LVDDX, are formed. The image signal line LVID1 is electrically connected to the conductive film 3e through the contact hole 42e which passes through the interlayer insulating film 42 or the like, and the conductive film 3e is electrically connected to the conductive film 6f through the contact hole 42f which passes through the interlayer insulating film 42 or the like.

On the one surface 10s side of the element substrate 10, the first semiconductor layer s which extends from a position overlapping the constant potential line LVDDX to a position overlapping the conductive film 6f, and the second semiconductor layer 1t which extends from a position overlapping the constant potential line LVSSX to a position overlapping the conductive film 6f, are formed. The first semiconductor layer 1s and the second semiconductor layer 1t are configured by a silicon film formed in the same layer as the semiconductor layer 1a. p type impurity and n type impurity are introduced into both sides of an extending direction of the first semiconductor layer 1s and the second semiconductor layer 1t, and pn junction areas 1sr and 1tr are configured in the center of an extending direction of the first semiconductor layer 1s and the second semiconductor layer 1t. In the first semiconductor layer 1s, a side in which the conductive film 6f is positioned is an anode 1sc (p area), and a side in which the constant potential line LVDDX is positioned is a cathode 1sd (n area). In the second semiconductor layer 1t, a side in which the constant potential line LVDDX is positioned is an anode 1tc (p area), and a side in which the constant potential line LVSSX is positioned is a cathode 1td (n area).

The constant potential line LVDDX is electrically connected to the cathode 1sd of the first semiconductor layer 1s through the contact hole 42g which passes though the interlayer insulating film 42 or the like, and the conductive film 6f is electrically connected to the anode 1sc of the first semiconductor layer 1s through the contact hole 42s which passes though the interlayer insulating film 42 or the like. The constant potential line LVSSX is electrically connected to the anode 1tc of the second semiconductor layer 1t through the contact hole 42h which passes though the interlayer insulating film 42 or the like, and the conductive film 6f is electrically connected to the cathode 1td of the second semiconductor layer 1t through the contact hole 42t which passes though the interlayer insulating film 42 or the like.

By doing this, the diode elements 91c and 92c are configured on an opposite side to the light transmitting substrate 10w with respect to the insulating film 12.

Configuration of Heat Dissipation Layers 8s and 8t

In the electro-optical device 100 configured in this way, the pn junction area 1sr of the first semiconductor layer 1s, and a heat dissipation layer 8r overlapping the pn junction area 1tr of the second semiconductor layer 1t in a plan view, are formed between the light transmitting substrate 10w and the insulating film 12. The heat dissipation layer 8r is configured by a conductive film which is formed in the same layer as the lower layer side light shielding layer 8a, and is configured by the same material as that of the lower layer side light shielding layer 8a. In the present embodiment, the heat dissipation layer 8r is formed so as to overlap the entire diode elements 91c and 92c in a plan view. Thus, the heat dissipation layer 8r overlaps the entire diode elements 91c and 92c through the insulating film 12, and in the insulating film 12, a thickness of a portion positioned between the heat dissipation layer 8r and the diode elements 91c and 92c is equal to or greater than 200 nm and is equal to or less than 1000 nm.

Since the configuration is also applied to the other image signal lines LVID2 to LVID6 in the same manner, description thereof will be omitted. Here, the diode elements 91c and 92c are formed in all the plurality of image signal lines LVID1 to LVID6, and the heat dissipation layer 8r is also formed with respect to all the diode elements 91c and 92c. In the present embodiment, the heat dissipation layer 8r extends in a strip shape between the constant potential line LVSSX and the constant potential line LVDDX, and the heat dissipation layers 8r which are provided with respect to the plurality of image signal lines LVID1 to LVID6 are continuously connected.

Main Effect of Present Embodiment

As described above, in the present embodiment, the diode elements 91c and 92c (electrostatic protection elements) are provided on an opposite side to the light transmitting substrate 10w with respect to the insulating film 12, and the heat dissipation layer 8r overlapping the pn junction areas 1sr and 1tr of the diode elements 91c and 92c in a plan view, are provided between the light transmitting substrate 10w and the insulating film 12. In addition, a thickness of the insulating film 12 positioned between the pn junction areas 1sr and 1tr of the diode elements 91c and 92c, and the heat dissipation layer 8r, are equal to or greater than 200 nm and is equal to or less than 1000 nm. For this reason, when the static electricity which is input to the image signal lines LVID1 to LVID6 from the terminals TVID1 to TVID6 is released through the diode elements 91c and 92c, even if a large current flows through the pn junction areas 1sr and 1tr of the diode elements 91c and 92c and thereby heat is generated, it is possible to make the heat escape into the heat dissipation layer 8r. Thus, even though the diode elements 91c and 92c (electrostatic protection elements) are formed on the insulating film 12, it is possible to reduce a loss due to heat generated in the diode elements 91c and 92c.

In addition, since the heat dissipation 8r overlaps the entire diode elements 91c and 92c in a plan view, it is possible to efficiently make the heat generated in the diode elements 91c and 92c escape into the heat dissipation layer 8r.

Another Embodiment

In the embodiments described above, a transmission type liquid crystal device is exemplified as an electro-optical device, but the invention may be applied to a reflection type liquid crystal device.

Another Electro-Optical Device

In the embodiments described above, as an electro-optical device, an example in which a liquid crystal device is used is described, but the invention is not limited to this, and may be applied to an electro-optical device, such as, an organic electroluminescence display device, a plasma display, a field emission display (FED), a surface-conduction electron-emitter display (SED), a light emitting device (LED) display device, or an electrophoretic display device.

In addition, the element substrate 10 which is used for the present embodiment can be regarded as a semiconductor device in which semiconductor elements (pixel switching element 30) are formed. Therefore, the invention can also be applied to a semiconductor device other than the electro-optical device 100, such as an image sensor.

Figure 9B:
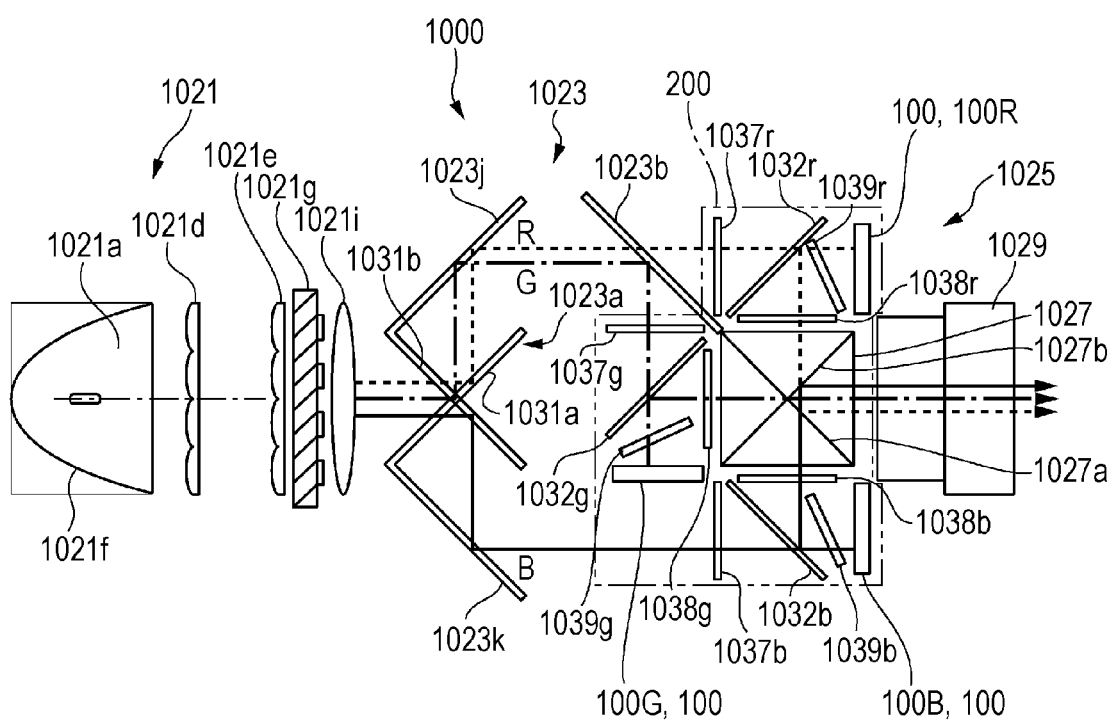

Mounting Example to Electronic Apparatus
Configuration Example of Projection Type Display Device and Optical Unit FIGS. 9A and 9B are schematic configuration diagrams of a projection type display device (electronic apparatus) to which the invention is applied and an optical unit. FIG. 9A is an explanatory diagram of a projection type display device which uses a transmission type liquid crystal device, and FIG. 9B is an explanatory diagram of a projection type display device which uses a reflection type liquid crystal device.

While a projection type display device 110 illustrated in FIG. 9A is an example in which a transmission type liquid crystal panel is used as a liquid crystal panel, a projection type display device 1000 illustrated in FIG. 9B is an example in which a reflection type liquid crystal panel is used as a liquid crystal panel. However, as will be described hereinafter, both the projection type display devices 110 and 1000 includes light source units 130 and 1021, a plurality of electro-optical devices 100 to which light with a wavelength bandwidth different from the light source units 130 and 1021 is supplied, cross dichroic prisms 119 and 1027 (photosynthesis optical system) which synthesizes light emitted from the plurality of electro-optical device 100 and emits the synthesized light, and projection optical systems 118 and 1029 which projects the light synthesized by the photosynthesis optical system. In addition, an optical unit 200 including the electro-optical device 100 and the cross dichroic prisms 119 and 1027 (photosynthesis optical system) is used for the projection type display device 110 and 1000.

First Example of Projection Type Display Device

The projection type display device 110 illustrated in FIG. 9A is a so-called projection type display device of a reflection type which radiates a screen 111 provided on a viewer side with light, and views the light reflected by the screen 111. The projection type display device 110 includes the light source unit 130 including a light source 112, dichroic mirrors 113 and 114, liquid crystal light valves 115 to 117, a projection optical system 118, the cross dichroic prism 119 (synthesis optical system), and a relay system 120.

The light source 112 is configured by an extra high pressure mercury lamp which supplies light including red light R, green light G, and blue light B. The dichroic mirror 113 makes the red light R from the light source 112 pass through, reflects the green light G and the blue light B. In addition, the dichroic mirror 114 makes the blue light B pass through and reflects the green light G, among the green light G and the blue light B which are reflected by the dichroic mirror 113. In this way, the dichroic mirrors 113 and 114 configures a color separation optical system which separates the light emitted from the light source 112 into the red light R, the green light G, and the blue light B.

Here, an integrator 121 and a polarization conversion element 122 are sequentially disposed from the light source 112, between the dichroic mirror 113 and the light source 112. The integrator 121 uniformizes illumination distribution of the light emitted from the light source 112. In addition, the polarization conversion element 122 polarizes the light from the light source 112, for example, polarizes so as to have a specific vibration direction like as s-polarized light.

The liquid crystal light valve 115 is a transmission type liquid crystal device that modulates the red light which passes through the dichroic mirror 113 and is reflected by the reflection mirror 123, according to an image signal. The liquid crystal light valve 115 includes a λ/2 phase difference plate 115a, a first polarizing plate 115b, the electro-optical device 100 (liquid crystal panel 100R for red color), and a second polarizing plate 115d. Here, even if the red light R incident on the liquid crystal light valve 115 passes through the dichroic mirror 113, polarization of the light is not changed, and thus includes s-polarized light as it is.

The λ/2 phase difference plate 115a is an optical element which converts s-polarized light incident on the liquid crystal light valve 115 into a p-polarized light. In addition, the first polarizing plate 115b is a polarizing plate which blocks the s-polarized light and makes the p-polarized light pass through. Thus, the electro-optical device 100 (liquid crystal panel 100R for red color) converts the p-polarized light into s-polarized light (if halftone, circularly polarized light or elliptically polarized light) by a modulation according to an image signal. Furthermore, the second polarizing plate 115d is a polarizing plate which blocks the p-polarized light and makes the s-polarized light pass through. Thus, the liquid crystal light valve 115 modulates the red light R according to an image signal and emits the modulated red light R toward the cross dichroic prism 119.

The λ/2 phase difference plate 115a and the first polarizing plate 115b are disposed in a state of being in contact with a light transmitting glass plate 115e which does not convert the polarized light, and the λ/2 phase difference plate 115a and the first polarizing plate 115b can avoid distortion due to heat.

The liquid crystal light valve 116 is a transmitting type liquid crystal device that modulates the green light G which is reflected by the dichroic mirror 113 and is reflected by the dichroic mirror 114, according to an image signal. The liquid crystal light valve 116 includes a first polarizing plate 116b, the electro-optical device 100 (liquid crystal panel 100g for green color), and a second polarizing plate 116d, in the same manner as the liquid crystal light valve 115. The green light G incident on the liquid crystal light valve 116 is the s-polarized light which is reflected by the dichroic mirrors 113 and 114 and incident. The first polarizing plate 116b is a polarizing plate which blocks the p-polarized light and makes the s-polarized light pass through. In addition, the electro-optical device 100 (liquid crystal panel 100G for green color) converts the s-polarized light into the p-polarized light (if halftone, circularly polarized light or elliptically polarized light) by a modulation according to an image signal. Then, the second polarizing plate 116d is a polarizing plate which blocks the s-polarized light and makes the p-polarized light pass through. Thus, the liquid crystal light valve 116 modulates the green light G according to an image signal and emits the modulated green light G toward the cross dichroic prism 119.

The liquid crystal light valve 117 is a transmitting type liquid crystal device that modulates the blue light B which is reflected by the dichroic mirror 113 and passes through the dichroic mirror 114 and passes through the relay system 120, according to an image signal. The liquid crystal light valve 117 includes a λ/2 phase difference plate 117a, a first polarizing plate 117b, the electro-optical device 100 (liquid crystal panel 100B for blue color), and a second polarizing plate 117d, in the same manner as the liquid crystal light valves 115 and 116. Here, the blue light B incident on the liquid crystal light valve 117 is reflected by the dichroic mirror 113, passes through the dichroic mirror 114 and is reflected by two reflection mirrors 125a and 125b, which will be described later, of the relay system 120, and thus becomes the s-polarized light.

The λ/2 phase difference plate 117a is an optical system which converts the s-polarized light incident on the liquid crystal light valve 117 into the p-polarized light. In addition, the first polarizing plate 117b is a polarizing plate which blocks the s-polarized light and makes the p-polarized light. Then, the electro-optical device 100 (liquid crystal panel 100B for blue color) converts the p-polarized light into the s-polarized light by a modulation according to an image signal. Furthermore, the second polarizing plate 117d is a polarizing plate which blocks the p-polarized light and makes the s-polarized light pass through. Thus, the liquid crystal light valve 117 modulates the blue light B according to an image signal and emits the modulated blue light B toward the cross dichroic prism 119. The λ/2 phase difference plate 117a and the first polarizing plate 117b are disposed in a state of being in contact with the glass plate 117e.

The relay system 120 includes relay lenses 124a and 124b, and reflection mirrors 125a and 125b. The relay lenses 124a and 124b are provided so as to prevent a light loss due to a long optical path of the blue light B. Here, the relay lens 124a is disclosed between the dichroic mirror 114 and the reflection mirror 125a. In addition, the relay lens 124b is disposed between the reflection mirrors 125a and 125b. The reflection mirror 125a is disposed so as to reflect the blue light B which passes through the dichroic mirror 114 and is emitted from the relay lens 124a toward the relay lens 124b. In addition, the reflection mirror 125b is disposed so as to reflect the blue light B which is emitted from the relay lens 124b toward the liquid crystal light valve 117.

The cross dichroic prism 119 is a photosynthesis optical system in which two dichroic films 119a and 119b are orthogonally disposed in an X shape. The dichroic film 119a is a film which reflects the blue light B and makes the green light G pass through, and the dichroic film 119b is a film which reflects the red light R and makes the green light G pass through. Thus, the cross dichroic prism 119 synthesizes the red light R, the green light G, and the blue light B which are modulated by each of the liquid crystal light valves 115 to 117, and emits the synthesized light toward the projection optical system 118.

The light incident on the cross dichroic prism 119 from the liquid crystal light valves 115 and 117 is s-polarized light, and the light incident on the cross dichroic prism 119 from the liquid crystal light valve 116 is p-polarized light. In this way, by setting the light incident on the cross dichroic prism 119 as different types of polarized light, the cross dichroic prism 119 can synthesizes the light incident from each of the liquid crystal light valves 115 to 117. Here, in general, the dichroic films 119a and 119b has excellent reflection transistor characteristics of polarization. For this reason, the red light R and the blue light B which are reflected by the dichroic films 119a and 119b are set as the s-polarized light, and the green light G which is reflected by the dichroic films 119a and 119b is set as the p-polarized light. The reflection optical system 118 includes a projection lens (not illustrated), and projects the light synthesized by the cross dichroic prism 119 onto the screen 111.

Second Example of Projection Type Display Device

The projection type display device 1000 illustrated in FIG. 9B includes a light source unit 1021 which generates a light source light, a color separation light guiding optical system 1023 which separates the light which is emitted from the light source unit 1021 into three color lights of red light R, green light G, and blue light B, and an optical modulation unit 1025 which is illuminated by the light source light of each color which is emitted from the color separation light guiding optical system 1023. In addition, the projection type display device 1000 further includes a cross dichroic prism 1027 (synthesis optical system) that synthesizes an image light of each color which is emitted from the optical modulation unit 1025, and a projection optical system 1029 that projects the image light which passes through the cross dichroic prism 1027 onto the screen (not illustrated).

In the projection display device 1000, the light source unit 1021 includes a light source 1021a, a pair of fly-eye optical systems 1021d and 1021e, a polarization conversion member 1021g, and an overlapping lens 1021i. In the present embodiment, the light source unit 1021 includes a reflector 1021f which is configured by a parabolic surface, and emits parallel light. The fly-eye optical systems 1021d and 1021e are configured by a plurality of element lenses which is disposed in a matrix form inside a surface orthogonal to a system optical axis, and the light source light is separated by the element lenses, is individually collected, and is individually dispersed. The polarization conversion member 1021g converts the light source light emitted from the fly-eye optical system 1021e into, for example, only parallel p-polarized light components in the figure, and then is supplied to an optical system on an optical path downstream side. The overlapping lens 1021i performs entire and appropriate convergence of the light source light which passes through the polarization conversion member 1021g, and thereby the plurality of electro-optical devices 100 provided in the optical modulation unit 1025 can be illuminated uniformly in overlapped manner.

The color separation light guiding optical system 1023 includes a cross dichroic mirror 1023a, a dichroic mirror 1023b, and reflection mirrors 1023j and 1023k. In the color separation light guiding optical system 1023, approximately the white light source light from the light source unit 1021 is incident on the cross dichroic mirror 1023a. While being reflected by the first dichroic mirror 1031a of one direction which configures the cross dichroic mirror 1023a, being reflected by the reflection mirror 1023j, passing through the dichroic mirror 1023*b*, and passing through an incident side polarizing plate 1037*r* and *p*-polarized light, The red light R is incident into the electro-optical device 100 (liquid crystal panel 100R for red color) as p-polarized light, through a wire grid polarizating plate 1032*r* which reflects s-polarized light, and an optical compensation unit 1039*r*.

In addition, while the green light G which is reflected by the first dichroic mirror 1031*a* is reflected by the reflection mirror 1023*j*, is also reflected by the dichroic mirror 1023*b*, and passes through the incident side polarizing plate 1037*g* and the p-polarized light, the green light G is incident into the electro-optical device 100 (liquid crystal panel 100G for green color) as p-polarized light, through a wire grid polarizing plate 1032*g* which reflects the s-polarized light and the optical compensation plate 1039*g*.

In contrast to this, while the blue light B that is reflected by a second dichroic mirror 1031*b* of the other direction which configures the cross dichroic mirror 1023*a* is reflected by the reflection mirror 1023*k*, and passes through the incident polarizing plate 1037*b* and p-polarized light, the blue light B is incident into the electro-optical device 100 (liquid crystal panel 100B for blue color) as p-polarized light, through a wire grid polarizing plate 1032*b* which reflects the s-polarized light and the optical compensation plate 1039*b*. The optical compensation plate 1039*r*, 1039*g*, and 1039*b* adjust a polarization state of incident light to and emitting light from the electro-optical device 100, and thereby characteristics of the liquid crystal layer are optically compensated.

In the projection type display device 1000 configured in this way, the lights of three colors which are incident after passing through the optical compensation plates 1039*r*, 1039*g*, and 1039*b* are respectively modulated in each electro-optical device 100. At this time, component light of s-polarized light, among the modulated light which are emitted from the electro-optical device 100, is reflected by the wire grid polarizing plate 1032*r*, 1032*g*, and 1032*b*, and is incident on the cross dichroic prism 1027 through emitting side polarizing plates 1038*r*, 1038*g*, and 1038*b*. A first dielectric multilayer film 1027*a* and a second dielectric multilayer film 1027*b* which intersects each other in an X shape are formed in the cross dichroic prism 1027, a first dielectric multilayer film 1027*a* of one direction reflects the red light R, the second dielectric multilayer film 1027*b* of the other direction reflects the blue light B. Thus, the lights of three colors are synthesized in the cross dichroic prism 1027, and are emitted from the projection optical system 1029. Thus, the projection optical system 1029 projects the color image light which is synthesized by the cross dichroic prism 1027 incident onto a screen (not illustrated) at a desired magnification.

Another Projection Type Display Device

The projection type display device may be configured so as to use an LED light source which emits light of each color, or the like as a light source unit, and to supply other liquid crystal devices with each color light emitted from the LED light source.

Other Electronic Apparatuses

The electro-optical device 100 to which the invention is applied, may be used as a direct-view display device in an electronic apparatus, such as, a mobile phone, a personal digital assistant (PDA), a digital camera, a liquid crystal television, a car navigation device, a television phone, a POS terminal, or an apparatus including a touch panel, in addition to the electronic apparatus described above.

The entire disclosure of Japanese Patent Application No. 2014-075166, filed Apr. 1, 2014 is expressly incorporated by reference herein.

What is claimed is:

1. An electro-optical device comprising:
   an insulating film that is provided above one surface side of a substrate;
   a pixel switching element that is provided above the insulating film;
   a light transmitting interlayer insulating film that is provided above the pixel switching element;
   a pixel electrode that is provided above the light transmitting interlayer insulating film and being electrically connected to a drain of the pixel switching element through the light transmitting interlayer insulating film;
   a data line that is provided above the one surface side of the substrate and being connected to a source of the pixel switching element;
   a signal line that is provided above the one surface side of the substrate and being connected to a source of the pixel switching element;
   a terminal that is provided above the one surface side of the substrate and being connected to the signal line for pixel signals;
   a potential line that is provided on one surface side of the substrate;
   an electrostatic protection element that is configured as a diode element which is provided above the insulating film, wherein the electrostatic protection element is electrically connected between the signal line and the potential line; and
   a heat dissipation layer that overlaps a pn junction area of the diode element in a plan view between the substrate and a portion in which a thickness of the insulating film is equal to or greater than 200 nm and is equal to or less than 1000 nm,
   wherein the light transmitting insulating film is formed above the signal line, the potential line, the electrostatic protection element, and the heat dissipation layer.

2. The electro-optical device according to claim 1, wherein the heat dissipation layer overlaps the entire diode element in a plan view.

3. An electronic apparatus comprising the electro-optical device according to claim 1.

4. An electronic apparatus comprising the electro-optical device according to claim 2.

5. A semiconductor device comprising:
   a substrate in which semiconductor elements are provided;
   an insulating film that is provided above one surface side of the substrate;
   a light transmitting interlayer insulating film that is provided above the insulating film;
   a signal line that is provided above one surface side of the substrate;
   a potential line that is provided on one surface side of the substrate;
   an electrostatic protection element that is configured as a diode element which is provided above the insulating film, wherein the electrostatic protection element is electrically connected between the signal line and the potential line; and
   a heat dissipation layer that overlaps a pn junction area of the diode element in a plan view between the substrate and a portion in which a thickness of the insulating film is equal to or greater than 200 nm and is equal to or less than 1000 nm, wherein the light transmitting insulating film is formed above the signal line, the potential line, the electrostatic protection element, and the heat dissipation layer.

* * * * *